(12) United States Patent
Sun et al.

(10) Patent No.: US 10,727,987 B2
(45) Date of Patent: Jul. 28, 2020

(54) FEEDBACK FOR CODEBLOCK GROUP BASED TRANSMISSIONS

(71) Applicant: QUALCOMM Incorporated, San Diego, CA (US)

(72) Inventors: Jing Sun, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1 day.

(21) Appl. No.: 15/939,165

(22) Filed: Mar. 28, 2018

(65) Prior Publication Data

US 2018/0287745 A1 Oct. 4, 2018

Related U.S. Application Data

(60) Provisional application No. 62/481,089, filed on Apr. 3, 2017.

(51) Int. Cl.
| | |
|---|---|
| *H04L 1/18* | (2006.01) |
| *H04L 1/00* | (2006.01) |
| *H03M 13/11* | (2006.01) |
| *H04L 5/00* | (2006.01) |

(52) U.S. Cl.
CPC ....... *H04L 1/1819* (2013.01); *H03M 13/1111* (2013.01); *H04L 1/0013* (2013.01); *H04L 1/1861* (2013.01); *H04L 1/1864* (2013.01); *H04L 5/0048* (2013.01); *H04L 5/0055* (2013.01)

(58) Field of Classification Search
CPC combination set(s) only.
See application file for complete search history.

(56) References Cited

U.S. PATENT DOCUMENTS

| | | | | |
|---|---|---|---|---|
| 2018/0278368 A1* | 9/2018 | Kim | ................... | H04L 1/1864 |
| 2018/0278454 A1* | 9/2018 | Islam | .................. | H04L 1/0038 |

OTHER PUBLICATIONS

International Search Report and Written Opinion—PCT/US2018/025229—ISA/EPO—dated Sep. 11, 2018.

(Continued)

*Primary Examiner* — Ian N Moore
*Assistant Examiner* — Brian T Le

(57) ABSTRACT

Various features related to a single bit ACK/NACK feedback for CBG based transmissions in a communication system are described. In an aspect, a base station may transmit, to a UE, a set of CBGs of a TB including a first subset of CBGs and a second subset of CBGs, the first subset of CBGs being transmitted on at least partially punctured resources. The base station may receive an ACK/NACK from the UE based on the transmitted set of CBGs, and retransmit to the UE one of the full set of CBGs or the first subset of CBGs based the received ACK/NACK. In an aspect, a UE may decode the set of CBGs received from the base station, transmit ACK/NACK feedback based on a result of the decoding, and receive, based on the transmitted ACK/NACK feedback, a retransmission of either the full set of CBGs, or the first subset of CBGs.

35 Claims, 14 Drawing Sheets

(56) References Cited

OTHER PUBLICATIONS

Convida Wireless: "Design Considerations for Preemptive Transmission", 3GPP Draft; R1-1705835 Design Considerations for Preemptive Transmission, 3rd Generation Partnership Project (3GPP), Mobile Competence Centre; 650, Route Des Lucioles ; F-06921 Sophia-Antipolis Cedex vol. RAN WG1, No. Spokane, USA; Apr. 3, 2017-Apr. 7, 2017 Apr. 2, 2017 (Apr. 2, 2017), XP051243947, Retrieved from the Internet: URL:http://www.3gpp.orgjftp/Meetings 3GPPSYNC/RAN1/Docs/[retrieved on Apr. 2, 2017], 5 pages.

Mediatek Inc: "URLLC and EMBB DL Multiplexing Using CRC", 3GPP Draft; R1-1612149 URLLC and EMBB Multiplexing Using CRC-Final, 3rd Generation Partnership-Project (3GPP), Mobile Competence Centre ; 650, Route Des Lucioles ; F-06921 Sophia-Antipolis Cedex ; Fra vol. RAN WG1, No. Reno, USA; Nov. 14, 2016-Nov. 18, 2016 Nov. 13, 2016 (Nov. 13, 2016), XP051176101, Retrieved from the Internet: URL:http://www.3gpp.org/ftp/Meetings3GPP SYNC/RAN1/Docs/ [retrieved on Nov. 13, 2016], 6 pages.

Mediatek Inc: "URLLC and EMBB DL Multiplexing using CRC Masking and MultibitNack Feedback", 3GPP Draft; R1-1702745 URLLC and EMBB Dl MultiplexingUsing CRC Masking and Multi Bit Nack Feeds Ack, 3rd Generation Partnership-Project (3GPP), Mobile Competence Centre ; 650, Route Des Lucioles ; F-0 vol. Ran Wg1, No. Athens; Feb. 13, 2017-Feb. 17, 2017 Feb. 12, 2017 (Feb. 12, 2017), XP051209892, Retrieved from the Internet:URL:http://www.3gpp.org/ftp/Meetings 3GPP SYNC/RAN1/Docsj [retrieved on Feb. 12, 2017], 6 pages.

Partial International Search Report—PCT/US2018/025229—ISA/EPO—dated Jul. 18, 2018.

Qualcomm Incorporated: "Use Cases of Multi-Bit HARQ-ACK Feedback", 3GPP Draft; R1-1705619 Use Cases of Multi-Bit HARQ-ACK Feedback, 3rd Generation Partnership Project (3GPP), Mobile Competence Centre ; 650, Route Des Lucioles ; F-06921 Sophia-Antipolis Cedex ; France vol. RAN WG1, No. Spokane, USA; Apr. 3, 2017-Apr. 7, 2017 Apr. 2, 2017 (Apr. 2, 2017), XP051243743, Retrieved from the Internet: URL:http://www.3gpp.org/ftp/Meetings 3GPP SYNC/RAN1/Docs/[retrieved on Apr. 2, 2017], 8 pages.

\* cited by examiner

FEEDBACK FOR CODEBLOCK GROUP BASED TRANSMISSIONS

CROSS-REFERENCE TO RELATED APPLICATION(S)

This application claims the benefit of U.S. Provisional Application Ser. No. 62/481,089 entitled "SINGLE BIT FEEDBACK FOR CBG BASED TRANSMISSIONS" filed on Apr. 3, 2017, which is expressly incorporated by reference herein in its entirety.

BACKGROUND

Field

The present disclosure relates generally to communication systems, and more particularly, to methods and apparatus related to single bit acknowledgment (ACK)/negative acknowledgment (NACK) feedback for codeblock group (CBG) based transmissions.

Background

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

Various features related to supporting a single bit ACK/NACK for CBG based transmissions in a communication system are described. In an aspect of the disclosure, a method, a computer-readable medium, and an apparatus are provided. The apparatus, e.g., a base station, may be configured to transmit, to a user equipment (UE), a set of codeblock groups (CBGs) including a first subset of CBGs and a second subset of CBGs, the first subset of CBGs being transmitted on at least partially punctured resources. For example, resource puncturing/preemption may refer to an operation in which a resource occupied by information/data corresponding to one type of communication, e.g., an ongoing Enhanced Mobile Broadband (eMBB) communication, may be punctured/preempted to carry information/data for another type of communication, e.g., a Ultra-Reliable and Low-Latency Communications (URLLC) type transmission. The apparatus may be further configured to receive, from the UE, an ACK/NACK feedback based on the transmitted set of CBGs. The apparatus may be further configured to retransmit, based the received ACK/NACK feedback, one of the set of CBGs or the first subset of CBGs. In some configurations, the apparatus may be further configured to transmit a CBG confirmation including information indicating one or more CBGs that were transmitted on punctured/partially punctured resources.

In an aspect of the disclosure, a method, a computer-readable medium, and an apparatus are provided. The apparatus, e.g., a UE, may be configured to decode a set of CBGs received from a base station, the set of CBGs including a first subset of CBGs and a second subset of CBGs, the first subset of CBGs having been transmitted on at least partially punctured resources. The apparatus may be further configured to transmit to the base station an ACK/NACK feedback based on the decoding. The apparatus may be further configured to receive from the base station, based on the transmitted ACK/NACK feedback, a retransmission of one of the set of CBGs or the first subset of CBGs.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
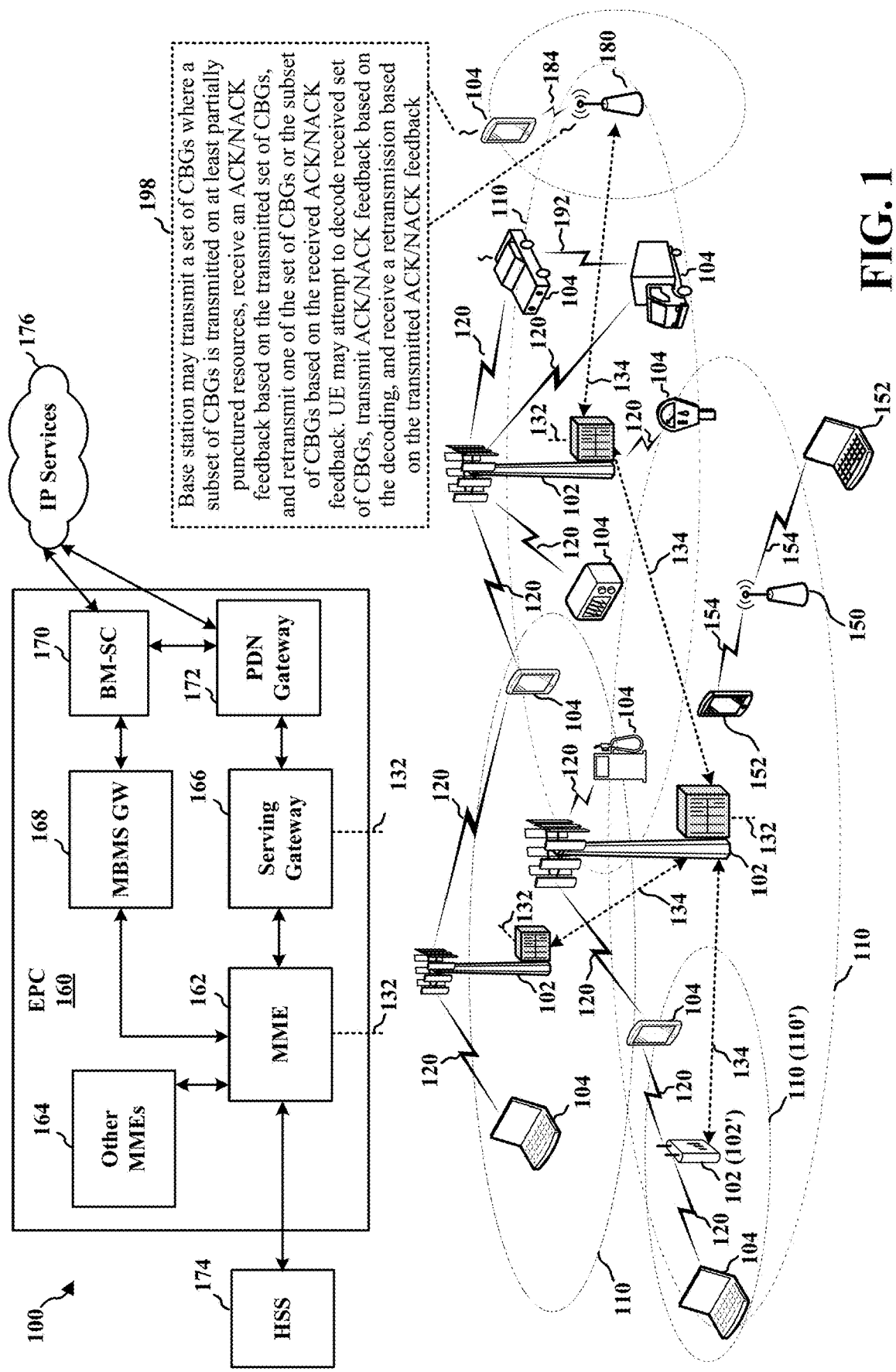
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, and an Evolved Packet Core (EPC) 160. The base stations 102 may include macro cells (high power cellular base station) and/or small cells (low power cellular base station). The macro cells include base stations. The small cells include femtocells, picocells, and microcells.

The base stations 102 (collectively referred to as Evolved Universal Mobile Telecommunications System (UMTS) Terrestrial Radio Access Network (E-UTRAN)) interface with the EPC 160 through backhaul links 132 (e.g., S1 interface). In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macro cells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100 MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or less carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

The gNodeB (gNB) 180 may operate in millimeter wave (mmW) frequencies and/or near mmW frequencies in communication with the UE 104. When the gNB 180 operates in mmW or near mmW frequencies, the gNB 180 may be referred to as an mmW base station. Extremely high frequency (EHF) is part of the RF in the electromagnetic spectrum. EHF has a range of 30 GHz to 300 GHz and a wavelength between 1 millimeter and 10 millimeters. Radio waves in the band may be referred to as a millimeter wave. Near mmW may extend down to a frequency of 3 GHz with a wavelength of 100 millimeters. The super high frequency (SHF) band extends between 3 GHz and 30 GHz, also referred to as centimeter wave. Communications using the mmW/near mmW radio frequency band has extremely high path loss and a short range. The mmW base station 180 may utilize beamforming 184 with the UE 104 to compensate for the extremely high path loss and short range.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service (PSS), and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The base station may also be referred to as a gNB, Node B, evolved Node B (eNB), an access point, a base transceiver station, a radio base station, a radio transceiver, a transceiver function, a basic service set (BSS), an extended service set (ESS), or some other suitable terminology without loss of generality. The base station 102 provides an access point to the EPC 160 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a toaster, or any other similar functioning device. Some of the UEs 104 may be referred to as IoT devices (e.g., parking meter, gas pump, toaster, vehicles, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Referring again to FIG. 1, in certain aspects, the base station 180 may be configured to transmit, to a UE (e.g., UE 104), a set of CBGs including a first subset of CBGs and a second subset of CBGs, the first subset of CBGs being transmitted on at least partially punctured resources, receive an ACK/NACK feedback from the UE based on the transmitted set of CBGs, and retransmit one of the set of CBGs or the first subset of CBGs to the UE based on the received ACK/NACK feedback (198). The UE 104 may be configured to decode the set of CBGs received from the base station, transmit to the base station an ACK/NACK feedback based on the decoding, and receive, based on the transmitted ACK/NACK feedback, a retransmission of one of the set of CBGs or the first subset of CBGs from the base station (198). Various features and techniques disclosed herein support low latency operations and the efficient use of air link resources, e.g., with support of dynamic resource sharing between URLLC and eMBB type communications.

Figure 2:
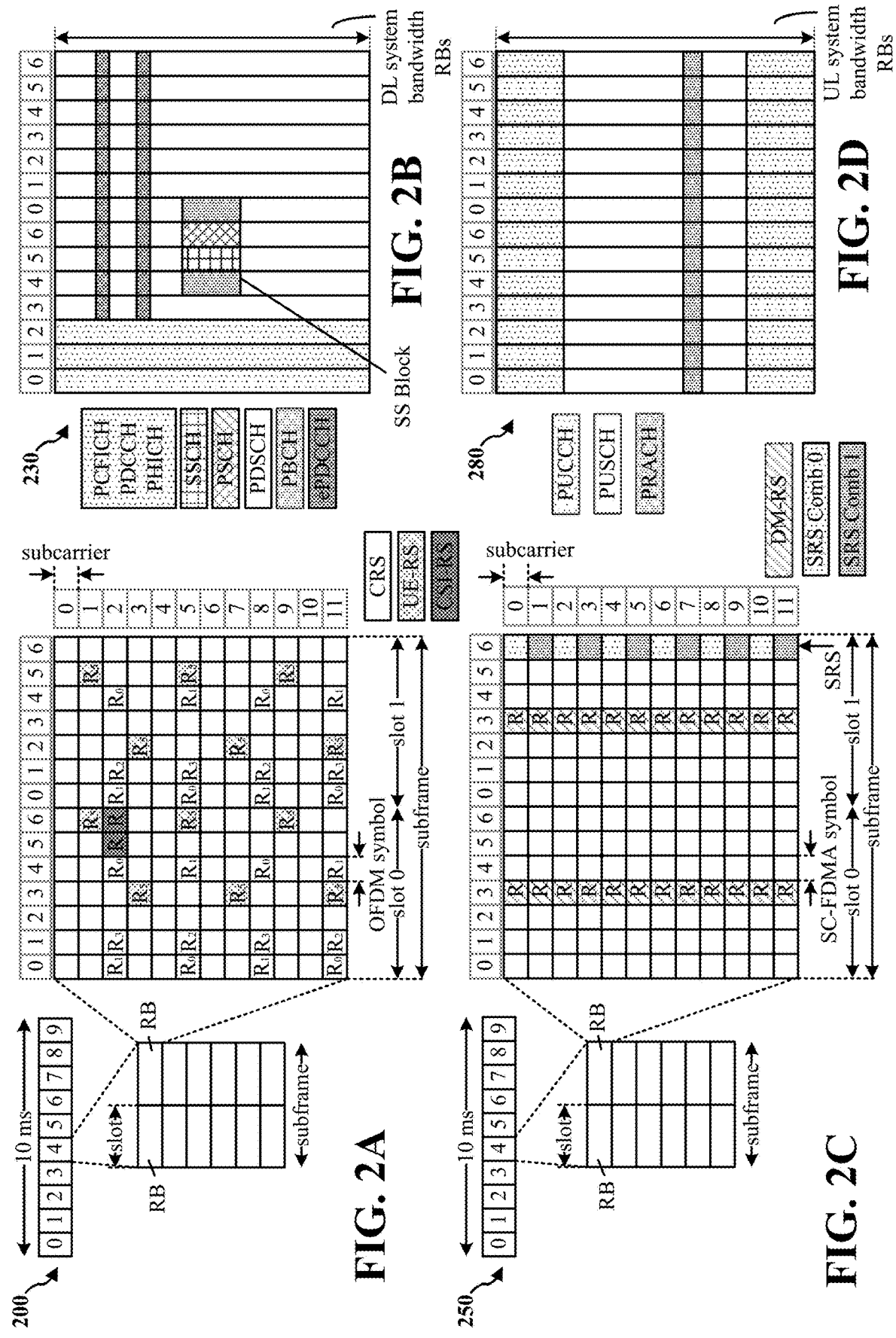
FIGS. 2A, 2B, 2C, and 2D are diagrams illustrating examples of a DL frame structure, DL channels within the DL frame structure, an UL frame structure, and UL channels within the UL frame structure, respectively.

FIG. 2A is a diagram 200 illustrating an example of a DL frame structure. FIG. 2B is a diagram 230 illustrating an example of channels within the DL frame structure. FIG. 2C is a diagram 250 illustrating an example of an UL frame structure. FIG. 2D is a diagram 280 illustrating an example of channels within the UL frame structure. Other wireless communication technologies may have a different frame structure and/or different channels. A frame (10 ms) may be divided into 10 equally sized subframes. Each subframe may include two consecutive time slots. A resource grid may be used to represent the two time slots, each time slot including one or more time concurrent resource blocks (RBs) (also referred to as physical RBs (PRBs)). The resource grid is divided into multiple resource elements (REs). For a normal cyclic prefix, an RB contains 12 consecutive subcarriers in the frequency domain and 7 consecutive symbols (for DL, OFDM symbols; for UL, SC-FDMA symbols) in the time domain, for a total of 84 REs. For an extended cyclic prefix, an RB contains 12 consecutive subcarriers in the frequency domain and 6 consecutive symbols in the time domain, for a total of 72 REs. The number of bits carried by each RE depends on the modulation scheme.

As illustrated in FIG. 2A, some of the REs carry DL reference (pilot) signals (DL-RS) for channel estimation at the UE. The DL-RS may include cell-specific reference signals (CRS) (also sometimes called common RS), UE-specific reference signals (UE-RS), and channel state information reference signals (CSI-RS). FIG. 2A illustrates CRS for antenna ports 0, 1, 2, and 3 (indicated as $R_0$, $R_1$, $R_2$, and $R_3$, respectively), UE-RS for antenna port 5 (indicated as $R_5$), and CSI-RS for antenna port 15 (indicated as R). FIG. 2B illustrates an example of various channels within a DL subframe of a frame. The physical control format indicator channel (PCFICH) is within symbol 0 of slot 0, and carries a control format indicator (CFI) that indicates whether the physical downlink control channel (PDCCH) occupies 1, 2, or 3 symbols (FIG. 2B illustrates a PDCCH that occupies 3 symbols). The PDCCH carries downlink control information (DCI) within one or more control channel elements (CCEs), each CCE including nine RE groups (REGs), each REG including four consecutive REs in an OFDM symbol. A UE may be configured with a UE-specific enhanced PDCCH (ePDCCH) that also carries DCI. The ePDCCH may have 2, 4, or 8 RB pairs (FIG. 2B shows two RB pairs, each subset including one RB pair). The physical hybrid automatic repeat request (ARQ) (HARQ) indicator channel (PHICH) is also within symbol 0 of slot 0 and carries the HARQ indicator (HI) that indicates HARQ acknowledgement (ACK)/negative ACK (NACK) feedback based on the physical uplink shared channel (PUSCH). The primary synchronization channel (PSCH) may be within symbol 6 of slot 0 within subframes 0 and 5 of a frame. The PSCH carries a primary synchronization signal (PSS) that is used by a UE to determine subframe/symbol timing and a physical layer identity. The secondary synchronization channel (SSCH) may be within symbol 5 of slot 0 within subframes 0 and 5 of a frame. The SSCH carries a secondary synchronization signal (SSS) that is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DL-RS. The physical broadcast channel (PBCH), which carries a master information block (MIB), may be logically grouped with the PSCH and SSCH to form a synchronization signal (SS) block. The MIB provides a number of RBs in the DL system bandwidth, a PHICH configuration, and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry demodulation reference signals (DM-RS) for channel estimation at the base station. The UE may additionally transmit sounding reference signals (SRS) in the last symbol of a subframe. The SRS may have a comb structure, and a UE may transmit SRS on one of the combs. The SRS may be used by a base station for channel quality estimation to enable frequency-dependent scheduling on the UL. FIG. 2D illustrates an example of various channels within an UL subframe of a frame. A physical random access channel (PRACH) may be within one or more subframes within a frame based on the PRACH configuration. The PRACH may include six consecutive RB pairs within a subframe. The PRACH allows the UE to perform initial system access and achieve UL synchronization. A physical uplink control channel (PUCCH) may be located on edges of the UL system bandwidth. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
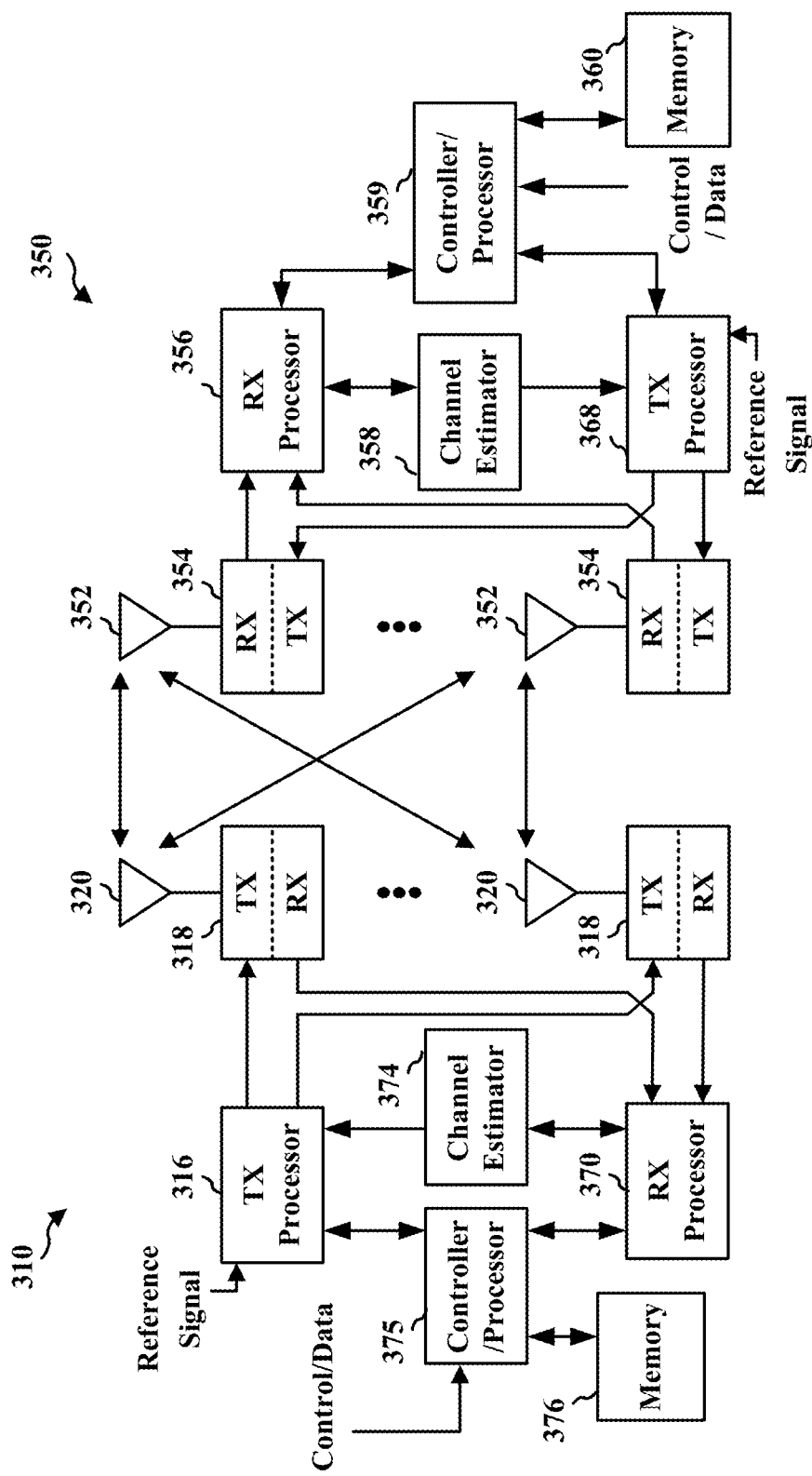
FIG. 3 is a diagram illustrating an example of a base station and a UE in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

As described herein, controller/processor 359/375 supports HARQ operations at the transport block (TB) level and/or CBG-level in which a device may request retransmission of a partial TB, e.g., one or more CBGs of a TB, or a full TB in which case all CBGs of the TB may be retransmitted. In accordance with various features described herein, in some configurations, retransmission of the full TB from the base station 310 may be triggered by a NACK from the UE 350, while retransmission of a subset of CBGs of a previously transmitted set of CBGs may be triggered by an ACK from the UE 350.

LTE and NR systems support many diverse applications that have stringent latency and/or reliability requirements such as the URLLC, and others such as the eMBB. In some NR systems, for example, dynamic resource sharing between URLLC and eMBB may be supported, e.g., with an indicator channel via which an indication of eMBB resources being punctured for use in transmitting URLLC data may be provided. For example, a resource occupied by an ongoing eMBB communication may be punctured/preempted for a URLLC type transmission. In such cases, a device, e.g., a base station, may provide an indication, e.g., on a downlink control channel such as the PDCCH, indicating the resources punctured to carry URLLC traffic to a UE which may be expecting eMBB type data on the punctured/preempted eMBB resource(s). The indication regarding the impacted eMBB resources may facilitate the UE's demodulating and decoding of the current transmission and subsequent retransmissions of the impacted eMBB data.

When puncturing occurs, the UE may likely fail to decode one or more CBGs corresponding to the punctured resources, e.g., CBGs that are transmitted on the punctured resources. A CBG level retransmission scheme may allow retransmission of failed CBGs rather than retransmission of an entire TB that included the CBGs. Such an approach is more efficient in the sense that other successfully decoded CBGs, e.g., that passed a cyclic redundancy check (CRC), are not retransmitted. However with such an approach, a CBG level ACK/NACK feedback may be needed, that is, an ACK/NACK bit per CBG may be needed to indicate which CBG is properly decoded and which is not. Thus if a bursty interference corrupts one or more codeblocks (CBs) of a CBG, the CBG may be retransmitted. While ideally, a retransmission at CB level is desirable, but the CBG concept provides a balance between ACK/NACK feedback overhead and the retransmission efficiency.

In one approach, CBG-based transmission with single bit HARQ ACK/NACK feedback may be supported. This approach may have, for example, one or more of the following features: CBG based (re)-transmission may be only allowed for the same TB of a HARQ process, CBGs for which a retransmission is requested may include all CBs/CBGs of a TB regardless of the size of the TB, in which case, the UE may report a single HARQ ACK bit for the TB, CBGs for which retransmission is requested may include one or more CBGs (e.g., a subset) of the TB, and CBG granularity may be configurable.

With regard to an aspect of eMBB resource puncturing for URLLC data transmission, an indication of the puncturing may be provided as discussed above. For example, a UE may get an eMBB assignment but may also monitor concurrent URLLC indication (e.g., at each mini-slot boundary) to see if any resources in its allocation are punctured by URLLC data transmission for other UEs. When such an indication is provided from the base station and the UE detects the indication, both the base station (e.g., gNB) and the UE are aware of the CBGs affected due to the resource puncturing. In accordance with one aspect, such knowledge of punctured resources and/or affected CBGs may be used to save overhead in uplink signaling, e.g., by eliminating or minimizing the need for CBG level ACK/NACK from the UE to the base station, as will now be discussed.

In accordance with an aspect, various configurations described herein support a single bit ACK/NACK for an eMBB TB with CBG level retransmissions. For example, an eMBB UE may receive a TB including a set of CBGs some of which may be affected/corrupted due to resource puncturing and thus may fail decoding at the UE. In such a case, in some configurations, the UE may send a one bit ACK for the TB. The single bit ACK may indicate that all CBGs/CBs that are not punctured are received. That is, the exemplary single bit ACK described herein may indicate that all, but the CBs/CBGs on punctured resources, are properly received and/or decoded at the UE. Since the base station and UE are aware of the impacted CBGs on the punctured resources due to the URLLC indication (from the base station to the UE), the UE may not need to send CBG level ACK/NACK when just the CBGs corresponding to the punctured resources fail decoding. Thus, by having a configuration where an agreement/understanding exists between the base station and the UE, a single bit (TB level) ACK may serve a dual purpose, e.g., acknowledging that all CBGs, except the ones that are on punctured resources, are successfully decoded, and implicitly/inherently also indicate the CBGs on the punctured resources need to be retransmitted (since the ACK is for all but punctured CBGs). In some, but not all, configurations, due to concurrent reception of the URLLC indication and the initial transmission of CBGs in the TB, the UE is able to determine which CBGs are affected due to puncturing (e.g., based on the punctured resources indicated in the URLLC indication), and may decide not to decode the affected CBGs and proceed to decode the rest of the CBGs in the TB. If the remaining CBGs are successfully decoded, the UE may send the single bit ACK as discussed above. In accordance with an aspect, the single bit ACK may trigger retransmission of the affected/punctured CBGs from the base station.

In a second case, when one or more additional CBGs (e.g., other than the affected CBGs corresponding to punctured resources) fail decoding at the UE, the UE may be configured to send a single bit NACK indicating that at least some of the transmitted CBs/CBGs which are not punctured are not received/decoded. In accordance with an aspect, in some configurations such a NACK triggers retransmission of the entire (full) TB, e.g., the same set of CBGs comprising the TB as were transmitted in the first transmission. In the event that the UE fails to detect/decode the URLLC indication indicating the punctured resources (which in turn may have allowed the UE to determine the affected CBGs), the UE may proceed to decode the received CBGs and perform CRC to determine successful decoding. If one or more CBGs are determined to have failed proper decoding, e.g., by checking if CRC for the one or more CBGs failed, the UE may send a single bit NACK. Again in this case, the base station, upon receiving the NACK, may retransmit the entire TB.

In accordance with another aspect, in addition to retransmitting just the punctured CBGs or the entire TB depending on whether the UE provides an ACK or NACK, in various configurations the base station provides a CBG confirmation (also referred to as a CBG list) in a retransmission grant. The retransmission grant may precede the retransmission of a subset of CBGs (e.g., associated with punctured resources) or full set of CBGs in some configurations. The CBG list may include the information from the previous URLLC indication (e.g., in an indicator channel) indicating the CBGs affected by the resource puncturing to carry URLLC data. Regardless of whether the UE was able to receive the previous URLLC indication, the CBG list may allow the UE to confirm which CBGs (corresponding to punctured resources) may have been affected in the first transmission. Unlike some other approaches, the information communicated in a CBG list described herein is not based on a ACK/NACK from the UE, but rather on the information communicated in the previous URLLC indication. For example, the information communicated in a CBG list described herein may reflect CBGs from the initial transmission that were punctured by the URLLC data as communicated by the URLLC indication, and does not require explicit, CBG-level ACK/NACK feedback from the UE. Many of the above discussed aspects and features will become clearer in view of the illustrations in FIGS. 4-8 and the discussion below.

Figure 4:
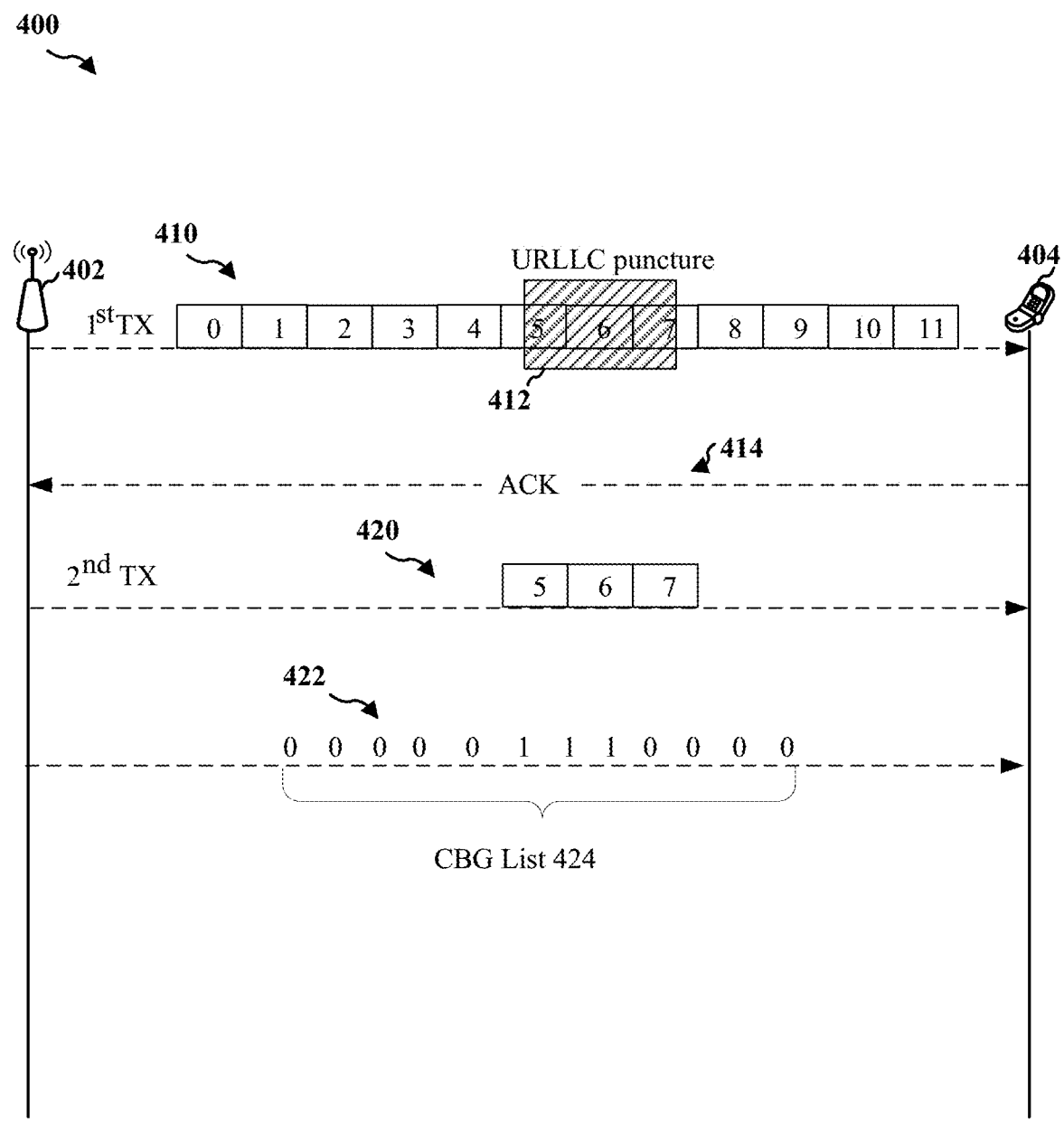
FIG. 4 illustrates communications between a base station and a UE in an exemplary communication system that supports dynamic resource sharing for Ultra-Reliable and Low-Latency Communications (URLLC) and Enhanced Mobile Broadband (eMBB) communications, in an example scenario where a retransmission is triggered by an exemplary ACK feedback.

FIG. 4 is a drawing 400 illustrating signaling exchange between a base station 402 and a UE 404 in an exemplary communication system that supports dynamic resource sharing between URLLC and eMBB data. When dynamic resource sharing between URLLC and eMBB type communication may occur, one or more eMBB resources are punctured/preempted for a URLLC type transmission. For example, with reference to FIG. 4 consider that the base station 402 needs to send URLLC data while an eMBB communication is ongoing. As dynamic resource sharing between URLLC and eMBB is supported, the base station 402 may puncture/preempt one or more resources (e.g., time-frequency resources) on which eMBB data is coded, e.g., resources for CBGs corresponding to the eMBB communication. In the example, the first ($1^{st}$) transmission 410 from the base station 402 communicates a TB including CBGs 0 to 11. However, the resources corresponding to CBGs 5 to 7 are punctured or partially punctured. Thus, CBGs 5 to 7 carrying eMBB data may be affected and may not be properly decoded at the UE 404. In some configurations, the base station 402 may also provide a URLLC indication 412 of the URLLC puncturing (shown by the diagonal pattern on the affected CBGs) indicating the punctured resources and/or CBGs that are affected. Upon receiving the URLLC indication 412, the UE 404 understands that CBGs corresponding to the expected eMBB data on the indicated punctured eMBB resources may be corrupt and may fail decoding. As discussed below, upon receiving the first transmission 410, the UE may decide to decode the received CBGs.

Assuming the UE 404 receives/detects the URLLC indication 412, the UE 404 knows that CBGs 5, 6 and 7 are corrupted (due to resource puncturing) and will likely fail decoding. The UE 404 may proceed to decode all CBGs of the received TB or may proceed to simply decode the non-affected CBGs (e.g., CBGs 0, 1, 2, 3, 4, 8, 9, 8, 10, 11). Assuming that all non-affected CBGs (e.g., 0-4 and 8-11) are successfully decoded, the UE may send an ACK 414. As discussed above, in accordance with an aspect of the present disclosure, the ACK 414 may indicate to the base station 402 that all, but the CBs/CBGs on punctured resources, are successfully decoded at the UE 404. Next, based on the understanding between the base station 402 and UE 404, the base station 402 may interpret the ACK as indicating that all non-punctured/non-affected CBGs are properly decoded at the UE 404. In response to the ACK, the base station 402 may send a retransmission 420 of the CBGs (5, 6 and 7) that were affected due to punctured/partially punctured resources in the first transmission 410. In various configurations, the retransmission ($2^{nd}$ Tx) 420 and the first transmission 410 correspond to the same HARQ process. That is, the retransmission 420 uses the same HARQ process as the first transmission 410. Furthermore, a new data indicator (NDI) in the retransmission 420 is left unflipped, e.g., to indicate the second transmission 420 is a retransmission of an earlier (first) transmission. As illustrated, the base station 402 may also send a CBG list 424 (e.g., in a retransmission grant 422) including information from the earlier URLLC indication 412 indicating the affected CBGs (and also indicating the retransmitted CBGs since in this example the retransmitted CBGs are the one or o more CBGs that were affected by resource puncturing). The CBG list 424 may be, e.g., a bitmap, where the 1's indicate the corresponding CBGs (mapped to the CBGs in the first transmission 410) that are affected due to resource puncturing. Since the UE 404 knows that an ACK was transmitted (having received the ACK 414), in some configurations the UE 404 may interpret the CBG list 424 to indicate the retransmitted CBGs included in the retransmission (e.g., retransmission) 420. The UE 404 may then proceed to decode the retransmitted CBGs 5, 6 and 7 and check whether the decoding is successful, e.g., by running a CRC.

Figure 5:
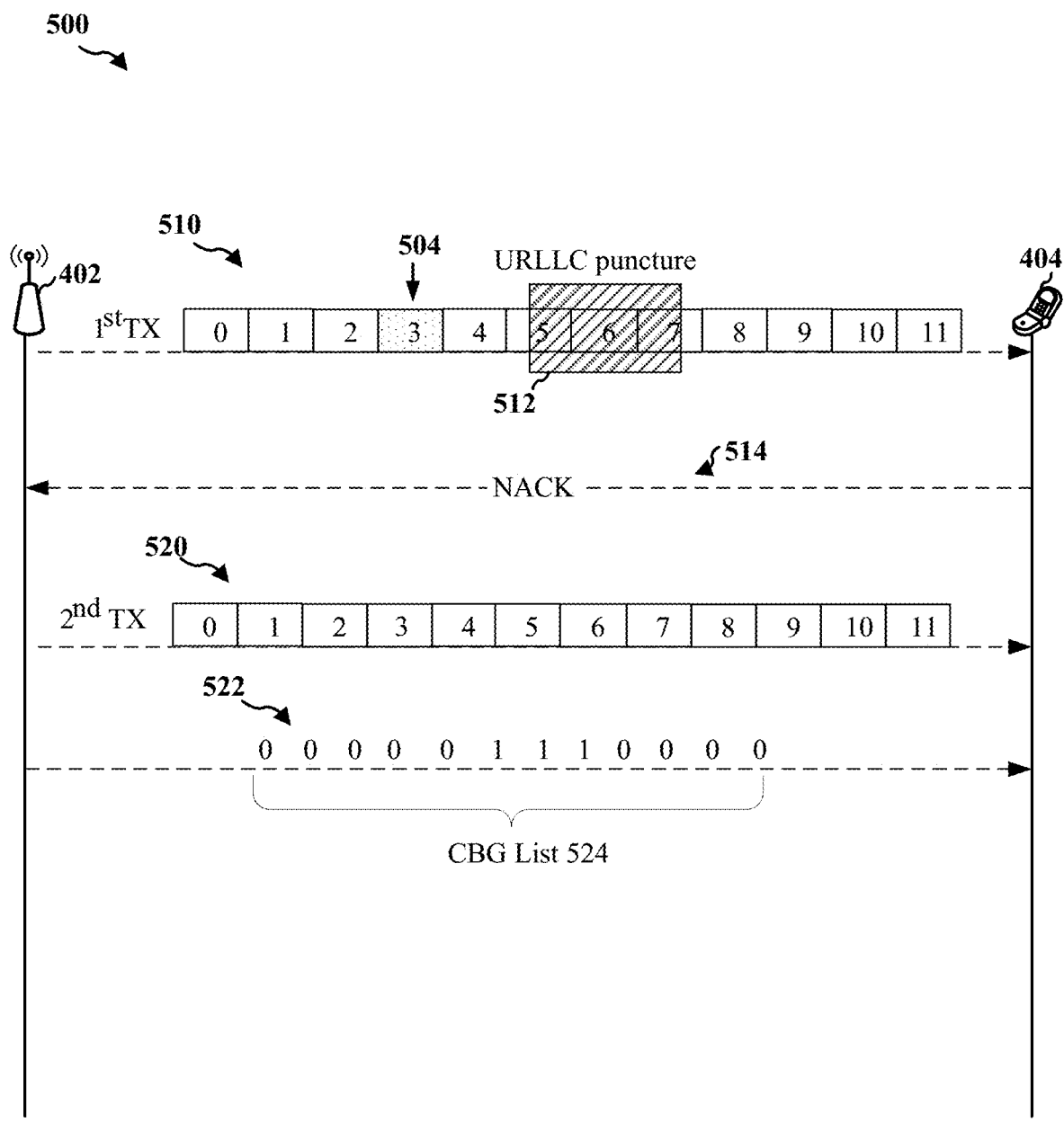
FIG. 5 illustrates signaling exchange between the base station and UE of the communication system of FIG. 4 in an example scenario where a retransmission is triggered by an exemplary NACK feedback.

FIG. 5 is a drawing 500 illustrating another signaling exchange between the base station and UE of the communication system of FIG. 4 in an example scenario where a retransmission is triggered by a NACK feedback. In the example illustrated in FIG. 5, the first ($1^{st}$) transmission 510 from the base station 402 may communicate a TB including CBGs 0 to 11. Similar to the previous example discussed with respect to FIG. 4, the resources corresponding to CBGs 5 to 7 may be punctured or partially punctured by the base station 402 to send URLLC data and thus the UE 404 may not be able to properly decode the CBGs 5, 6 and 7. The base station 402 may also provide a URLLC indication 512 of the URLLC puncturing indicating the punctured resources and/ or CBGs that are affected. Assuming that the UE 404 receives/detects the URLLC indication 512, the UE 404 understands that CBGs 5, 6 and 7 corresponding to the indicated punctured eMBB resources may be corrupt and may not be decoded.

Next, the UE 404 may proceed to decode the received transmission 510. Since the assumption is that the UE 404 received the URLLC indication 512 and thus knows the affected CBGs, the UE 404 may either attempt to decode all received CBGs or may just decode the non-punctured CBGs (e.g., CBGs 0, 1, 2, 3, 4, 8, 9, 8, 10, 11) which have not been indicated in the URLLC indication 512 to be affected by resource puncturing. For discussion purposes, consider that in this example while CBG 3 504 is not affected due to the resource puncturing, the CBG 3 504 fails decoding at the UE 404, e.g., due to erroneous reception, decoding error and/or interference at the UE 404. In accordance with one aspect, the UE 404 may be configured to NACK a received transmission in the case when at least one CBG other than the CBGs indicated (in the URLLC indication 512) as punctured fails decoding. Thus in this example, the UE 404 sends a NACK 514 since the UE 404 fails to decode CBG 3 504 which is not included in the group of CBGs (5, 6, 7) on punctured resources. The NACK 514 may indicate to the base station 402 that at least CBG other than punctured CBGs (CBs/CBGs on punctured resources), is not successfully decoded at the UE 404. The base station 402 may interpret the NACK 514 as indicating that some CBGs other than the punctured/affected CBGs failed decoding at the UE 404, and may sends in response to the NACK, a retransmission 520 of the full TB including all CBGs. In various configurations, the retransmission ($2^{nd}$ Tx) 520 and the first transmission 510 correspond to the same HARQ process, and a NDI in the retransmission 520 is not flipped to indicate the second transmission 520 is a retransmission of an earlier (first) transmission. As illustrated, the base station 402 may also send a CBG list 524, in a retransmission grant 522, including information from the earlier URLLC indication 512 indicating the CBGs affected due to resource puncturing (and not the entire set of CBGs that are retransmitted). While the full set of CBGs from first transmission 510 are retransmitted in retransmission 520, the CBG list 524 indicates the CBGs which were punctured in first transmission 510. In this way, in some configurations based on the information in the retransmission grant the UE 404 may decide whether any log likelihood ratios (LLRs) based on the first transmission 510 can be utilized for soft combining as will be discussed in more detail. While the CBG list 524 may be communicated in a various ways, in some configurations the CBG list 524 may be in the form of a bitmap as discussed in the previous example. The UE 404 may then proceed to decode the CBGs of the retransmitted TB and check whether the decoding is successful or not.

The above examples illustrated with respect to FIGS. 4-5 assume that the URLLC indication is detected and correctly decoded by the UE 404 and thus the UE 404 knows which CBGs are on punctured resources to the UE 404. In such cases, prior to or as part of the decoding the CBGs received in a retransmission, UE 404 may simply null out the LLRs (e.g., stored from decoding of the CBGs from a first transmission) corresponding to the CBGs received on the impacted resources and not use the erroneous LLRs (for CBGs on punctured resources) for soft combining when decoding CBGs of the received retransmission. The nulling out of erroneous LLRs may be possible because of the URLLC indication which allows the UE 404 to determine the affected CBGs. However, there is possibility that the UE 404 may miss out/not detect the URLLC indication and may not know which CBGs are affected due to puncturing. In such cases, there is a greater likelihood of decoding errors at the UE 404 due to soft combining of erroneous LLRs corresponding to CBGs on punctured resources and propagation of such error in future decodings at the UE 404. One example of such a case is discussed with regard to FIG. 6 where the UE 404 fails to detect a URLLC indication from the base station 402 and uses the CBG list to avoid use of erroneous LLRs in future decoding.

Figure 6:
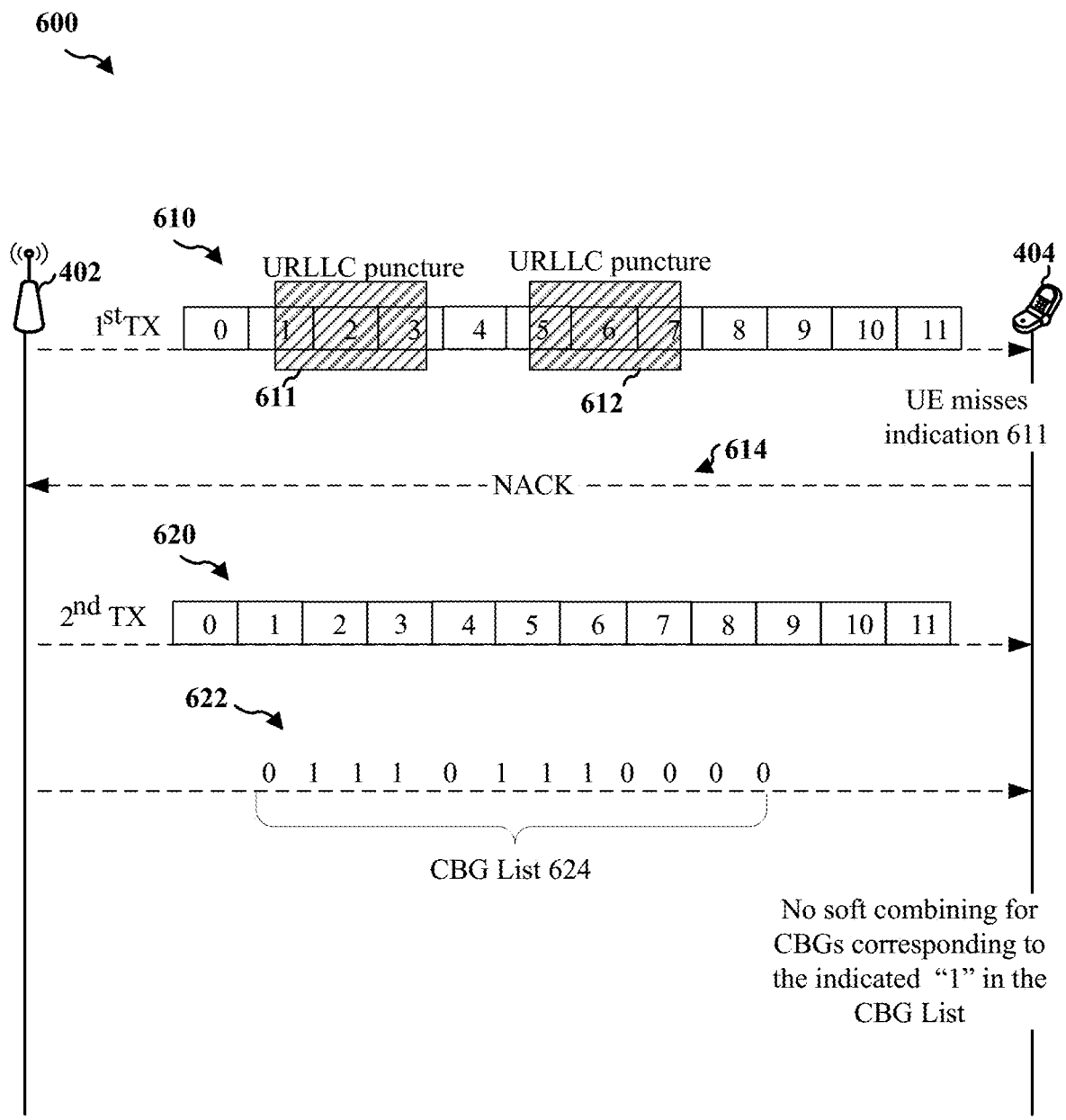
FIG. 6 illustrates a specific example of signaling exchange between the base station and the UE and processing in yet another scenario where a retransmission is triggered by a NACK feedback.

FIG. 6 is a drawing 600 illustrating signaling exchange between the base station 402 and the UE 404 and processing in an example scenario where the UE 404 fails to receive/detect a preemption indication (e.g., URLLC indication). As discussed in the example, in such a case the UE 404 may use an exemplary CBG list to null out erroneous LLRs and reduce the likelihood future decoding errors. In the example, the first ($1^{st}$) transmission 610 from the base station 402 communicates a TB including CBGs 0 to 11. The resources corresponding to CBGs {1, 2, 3} and {5, 6, 7} may be punctured or partially punctured by the base station 402 to carry URLLC data and thus the UE 404 may likely be unable to properly decode the CBGs {1, 2, 3} and {5, 6, 7}. In the example, while the base station 402 may provide URLLC indications 611 and 612 of the URLLC puncturing indicating the punctured resources and/or CBGs that are affected, it is assumed that the UE fails to detect the indication 611, e.g., due to channel conditions and/or other error at the UE 404. Thus, in this case the UE 404 may not be aware that CBGs {1, 2 and 3} are on punctured resources. In such a case, the UE 404 may simply assume that only CBGs {5, 6 and 7} are on punctured resources and proceed with decoding the received CBGs. The UE 404 may attempt to decode all received CBGs or alternatively just the CBGs that are not on punctured resources based on the received URLLC indication 612. As part of the decoding, the UE 404 may generate LLRs of the CBGs being decoded and store the LLRs for use in potential decoding refinement, e.g., by soft combining of the LLRs in subsequent future decoding, in case a retransmission of CBGs is expected. If all received CBGs including the ones on punctured resources (e.g., CBGs {1, 2, 3} and {5, 6, 7}) are decoded, the UE 404 may store the LLRs corresponding to all of the decoded CBGs. In some configurations, because the UE 404 receives the URLLC indication 612 and knows that CBGs {5, 6, 7} are on punctured resources, the UE 404 may or may not attempt to decode CBGs {5, 6, 7}, and even if decoded the UE 404 may not use the LLRs corresponding to CBGs {5, 6, 7} for soft combining in future decoding of the retransmitted CBGs given that the UE 404 is aware that the CBGs {5, 6, 7} are punctured (due to the indication 612) and the corresponding LLRs may be unreliable However, since the UE 404 does not receive the indication 611, the UE 404 may attempt to decode CBGs {1, 2, 3} and store the LLRs corresponding to CBGs {1, 2, 3} for possible soft combining of LLRs later. In the example, the decoding may fail for CBGs {1, 2, 3} and {5, 6, 7} that are (partially or fully) in punctured resources. While the UE 404 is aware that the CBGs are on punctured resources and thus may expect that decoding of CBGS {5, 6, 7} may fail, the UE 404 may not have similar expectations for CBGs {1, 2, 3} since the UE 404 missed the indication 611. Because the UE 404 missed out the indication 611 and does not know that CBGs {1, 2, 3} are on punctured resources, the UE 404 may assume that the decoding failure of CBGs {1, 2, 3} may be a normal failure to decode CBGs on non-punctured resources and thus may send a NACK 614 to the base station 402.

Upon receiving the NACK 614, the base station 402 may retransmit the entire TB in a second transmission (e.g., retransmission) 620. However, the UE 404 does not know that CBGs {1, 2, 3} in the first transmission 610 were on punctured resources (due to missing the indication 611) and thus the LLRs corresponding to CBGs {1, 2, 3} generated by the UE 404 after receiving the first transmission 610 may be erroneous and thus unreliable. Thus, the UE 404 does not know that the UE 404 should not perform soft combining for the CBGs {1, 2, 3} based on the previously generated LLRs for the CBGs {1, 2, 3} which may be erroneous. In the absence of a notification mechanism to indicate to the UE 404 that the previously generated LLRs corresponding to CBGs {1, 2, 3} may be incorrect and should be nulled, the UE 404 may soft-combine the potentially erroneous LLRs corresponding to CBGs {1, 2, 3} with newly generated LLRs corresponding to retransmitted CBGs {1, 2, 3}. Such soft combining that uses erroneous LLRs may lead to subsequent/future decoding errors and the errors may propagate. However, the communication of the exemplary CBG list as described herein addresses and obviates the problem by providing the same information that the UE 404 missed earlier due to a failure to detect the URLLC indication 611 as will now be discussed in more detail.

Referring back to FIG. 6, after sending the NACK 614, in addition to monitoring for retransmission (e.g., retransmission) 620, the UE 404 may also monitor for a CBG confirmation/list in a retransmission grant. As illustrated, the base station 402 may send (e.g., in a retransmission grant 622) the CBG list 624 including information from the earlier indication 611 (which the UE 404 missed earlier) and URLLC indication 612, indicating the CBGs affected due to resource puncturing. As shown in drawing 600, the CBG list 624 includes a bitmap with 1's in locations corresponding to the affected CBGs which were on punctured resources in the first transmission 610. From the received CBG list 624, the UE 404 may determine that CBGs {1, 2, 3} and {5, 6, 7} were on punctured resources in the first transmission 610. In this example, the CBG list 624 also serves as an indication that the earlier generated LLRs corresponding to the CBGs indicated in the CBG list 624 should be nulled out/voided and no soft combining should be performed for such CBGs. Accordingly, the UE 404 nulls out the previously generated LLRs (e.g., by clearing/resetting the LLR buffers) corresponding to CBGs {1, 2, 3} and {5, 6, 7} and does not perform soft combining for these CBGs. While the UE 404 may perform soft combining for other remaining CBGs (e.g., CBGs 0, 4, 8 to 11) based on the previously generated LLRs (based on decoding of CBGs from the first transmission 610) and newly generated LLRs (based on decoding from the retransmission 620), the UE 404 may proceed to decode the retransmitted CBGs {1, 2, 3} and {5, 6, 7} without soft combining. Accordingly, in some configurations the CBG list 624 may be used by the UE 404 to reset the LLR buffers, e.g., to null out previously generated incorrect LLRs and stop soft combining based on the incorrect LLRs. Thus, in the above discussed manner, by introducing a CBG list of the type described herein, the propagation of decoding errors may be avoided even when the UE 404 fails to detect/receive a URLLC indication.

From the above discussion, it may be appreciated that in accordance with various features described herein, from the perspective of the base station 402, when a retransmission is triggered by a NACK, the base station 402 may be configured to retransmit the entire TB but may also send a CBG list. The retransmission of the TB corresponds to the same HARQ process as the TB in the first transmission, e.g., the TB of the initial transmission 610 and the TB of the retransmission 620 are associated with the same HARQ process as the TB in the first transmission. Also, as discussed above, the CBG list may be included in a retransmission grant and may list the CBGs on punctured resources to allow the UE 404 to not perform soft combining (of LLRs) for the punctured CBGs. This aspect is especially more useful in cases where the UE 404 fails to detect a URLLC indication of punctured resources from the base station. When retransmission is triggered by an ACK, the base station 402 may be configured to retransmit only the failed CBGs, e.g., the CBGs corresponding to the punctured resources. The base station 402 may be further configured to send the retransmission grant including the CBG list that may indicate the failed/punctured CBGs. The CBG list may be based on the indication transmitted on an indication channel, e.g., the URLLC indication transmitted to the UE 404.

While unlikely, there may be a possibility of a case when the UE reports ACK but the indication channel is missed by the UE. For example, consider that the UE missed an indication of punctured resources, but the received CBGs pass decoding, e.g., there may be a few punctured resources (e.g., REs) affecting a CBG but the CBG passes decoding at the UE. While the base station may have provided an indication in the indication channel regarding the punctured resources, for discussion purposes assume the UE somehow missed the indication. In such a case, because the base station is aware of the resource puncturing and under the assumption that the UE received the indication of punctured resources, the base station upon receiving the ACK from the UE may retransmit the failed CBGs in a retransmission (with the understanding that UE is sending an ACK to indicate that all but the punctured CBGs have been successfully decoded). However, if a CBG list is not sent from the base station, the UE may misunderstand the content of the retransmission, since the UE missed out the earlier indication and from UE perspective the CBG decoding passed and there should not be a need for retransmission (e.g., since the indication is missed and decoding is successful, the UE may consider the case to be a normal transmission without resource sharing/puncturing being applied. Thus, it may be appreciated that a CBG list is still useful even in the unlikely case where the UE fails to detect the indicator channel, successfully decodes the CBGs and reports an ACK, as without the CBG list, the UE may misunderstand the content of the retransmission.

In one configuration, the UE behavior in accordance with the methods described herein may be characterized as follows: for a HARQ process, when the UE detects an indication of punctured resources, e.g., in an indication channel, the UE may perform decoding of received CBGs and report ACK/NACK based on the decoding result of CBGs not covered in the indication. That is, when a URLLC indication as discussed with respect to FIGS. 4-6 is received, the UE may determine to send an ACK or NACK based on whether the CBGs other than the CBGs indicated to be affected by resource puncturing (e.g., not covered in the URLLC indication) passed or failed decoding.

In some configurations, when a UE receives retransmission grant (including the CBG list) following an ACK transmission, the UE may be configured to compare the CBGs indicated in the CBG list with CBGs known to be affected by resource puncturing from the previously received indication. If the comparing indicates that the CBGs indicated in the CBG list are the same as the CBGs determined from the earlier indication, the UE may continue decoding the retransmitted CBGs without performing soft combining for the punctured CBGs. If the comparing indicates that the CBGs are not the same (for example the CBGs listed in the CBG list may be a super set of the CBGs indicated in an earlier received indication), the UE may decode the retransmitted CBGs without soft combining, e.g., null out the previously generated LLRs corresponding to the CBGs indicated in the CBG list and decode without soft combining the LLRs corresponding to the CBGs indicated in the CBG list. In the cases where a NACK is reported, the base station may retransmit the entire TB. In some configurations, when a UE receives a retransmission grant (including CBG list) following reporting of a NACK, the UE may be configured to reset/null out the previously generated LLRs for the CBGs indicated in the CBG list and decode without soft combining. For other remaining CBGs (not indicated in the CBG retransmission) the UE may decode with soft combining for better decoding results.

The earlier discussed configurations discussed in connection with FIGS. 4-6 assume that an ACK or NACK transmitted from the UE 404 will be successfully received/decoded at the base station 402. For example, in each of the examples discussed with respect to FIGS. 4-6, assume that the single bit ACK/NACK feedback (414/514/614) from the UE 404 is correctly received/decoded by the base station 402, and there is no misunderstanding between the UE 404 and base station 402 with regard to the ACK/NACK feedback. However, it is possible that due to an error in receiving/decoding the ACK/NACK feedback from the UE 404, the base station 402 may interpret a received ACK as a NACK (referred to as an ACK to NACK error) or interpret a received NACK as an ACK (referred to as a NACK to ACK error). Thus, as should be appreciated, protection against such errors may be needed. As will now be discussed, some configurations anticipate the possibility of a ACK to NACK or NACK to ACK type error and provide a mechanism for protection against such errors.

Figure 7:
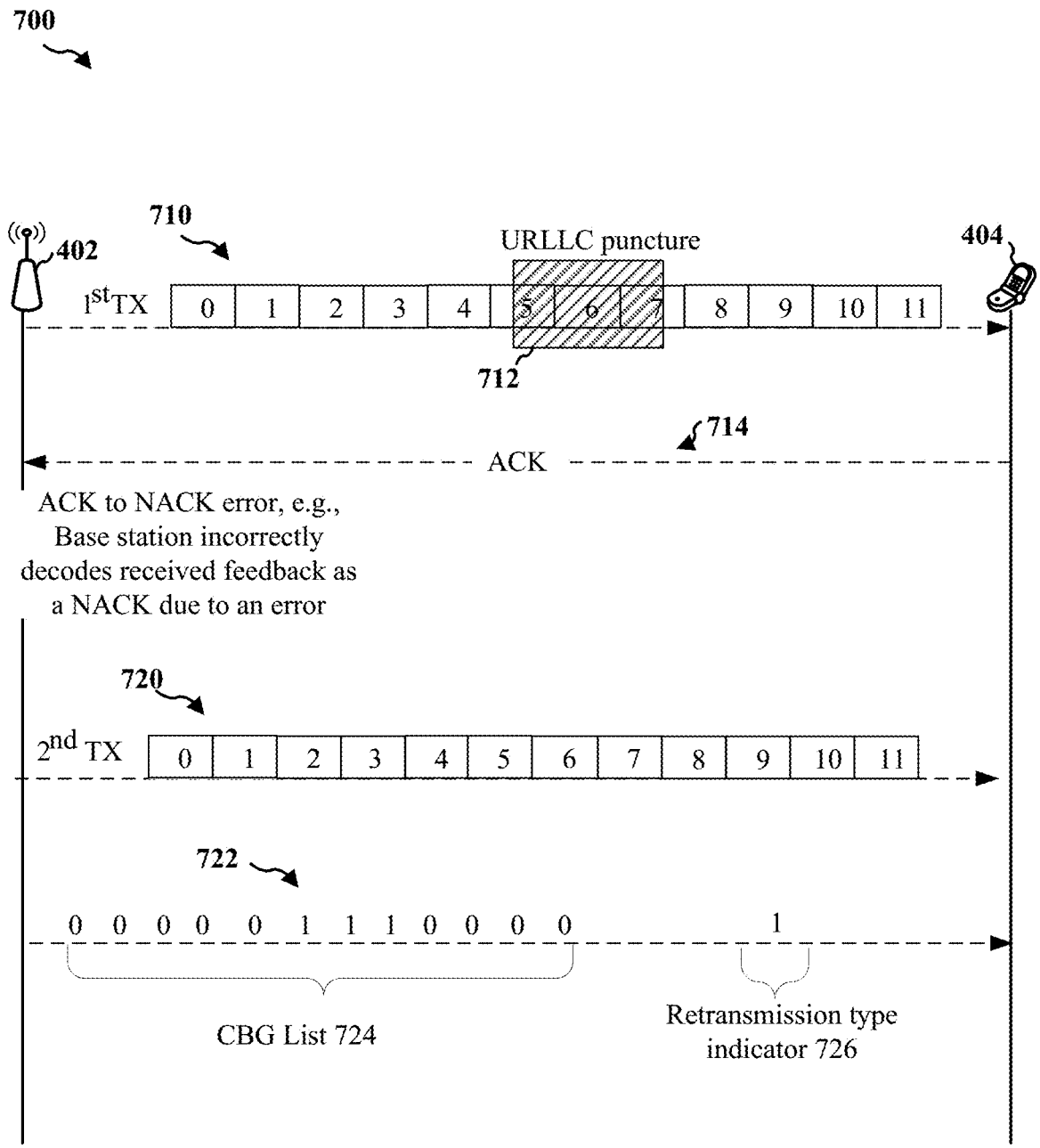
FIG. 7 illustrates signaling exchange between the base station and UE of the communication system of FIG. 4 in an example scenario where an ACK to NACK error occurs, e.g., where a transmitted ACK is incorrectly interpreted by the base station as a NACK due to a receiving/decoding error.

For better appreciation and understanding of the above concept, consider first an example of an ACK to NACK error illustrated in FIG. 7. FIG. 7 includes a drawing 700 illustrating an example where an ACK to NACK error occurs, e.g., where the base station 402 incorrectly interprets a transmitted ACK as a NACK (e.g., due to a receiving/decoding error at the base station).

In the example illustrated in FIG. 7, the UE 404 may receive a first ($1^{st}$) transmission 710 from the base station 402 of a TB including a set of CBGs 0 to 11. Similar to the example discussed earlier with respect to FIG. 4, the resources corresponding to CBGs 5 to 7 may be punctured or partially punctured and the base station 402 may provide a URLLC indication 712 of the URLLC puncturing (shown by the diagonal pattern on the affected CBGs) indicating the punctured resources. Depending on whether the UE 404 receives/detects the URLLC indication 712, the UE 404 may be able to determine that CBGs 5, 6 and 7 are on punctured resources and will likely fail decoding. The UE 404 may proceed to decode the received CBGs. Furthermore, for this example consider that all non-affected CBGs (e.g., 0-4 and 8-11) are successfully decoded, and thus the UE may send an ACK feedback 714 to the base station 402. In this example, consider that the base station 402 receives the ACK feedback 714, but due to an error, the base station 402 incorrectly reads the received feedback as a NACK instead of the intended ACK. While the sent feedback's (ACK 714) intended purpose is to indicate to the base station 402 that all, but the CBs/CBGs on punctured resources (i.e., CBGs 5-7), are successfully decoded at the UE 404, due to the error, the base station 402 reads the feedback as a NACK and interprets that at least some CBGs other than the punctured CBGs failed decoding at the UE 404. Based on the understanding between the base station 402 and UE 404, the base station 402 may assume that the entire set of CBGs (CBGs 0-11) needs to be retransmitted and thus sends a retransmission 720 including the full set of CBGs. While the base station 402 retransmits the full set of CBGs, the UE 404, knowing that the UE sent an ACK feedback 714, may expect to receive only the failed CBGs in the retransmission 720, e.g., CBGs 5-7 only.

Similar to the example previously discussed with respect to FIG. 4 example, the base station 402 may also send a retransmission grant 722 including a CBG list 724 (based on the information from the earlier URLLC indication 712) indicating the affected CBGs. From the perspective of the base station 402, the CBG list 724 is sent in response to/following receipt of a NACK (due to incorrect reception/ decoding of the ACK by the base station 402) with the intention to prevent soft combining, e.g., by indicating the affected CBGs for which the corresponding LLRs generated by the UE 404 should be nulled/reset by the UE 404. However, from the perspective of UE 404, the retransmission grant 722 including the CBG list 724 is received in response to a transmitted ACK feedback 714, and the UE 404 may interpret the CBG list 724 as an indication of which CBGs are retransmitted in the retransmission 720 since an ACK feedback 714 was transmitted from the perspective of UE 404 (e.g., UE 404 may interpret the CBG list 724 based on whether the UE 404 transmitted an ACK or a NACK). Thus, due to the ACK to NACK error, a potential misunderstanding/misinterpretation of the CBG list/confirmation field of the retransmission grant 722 may occur. The potential misunderstanding/misinterpretation may be due to the two ways of interpreting the CBG list 724 which depends on a consistent understanding of the ACK or NACK at both the base station 402 and the UE 404.

To avoid such misunderstanding/misinterpretation of the CBG list that may be caused by an ACK to NACK (or NACK to ACK) error, in accordance with one aspect, an exemplary retransmission type indicator 726 may be included in the retransmission grant 722 in addition to the CBG list 724 as illustrated in FIG. 7. The retransmission type indicator 726 may explicitly indicate if the retransmission includes the full set of CBGs or just the failed CBGs, and may be used by the UE 404 to correctly interpret what the CBG list 724 is intended to indicate. For example, the retransmission type indicator 726 may be a single bit indicator having a value 0 or 1, where a "1" may indicate that the full TB, e.g., full set of CBGs, is retransmitted in the retransmission 720 while a "0" may indicate that only failed CBGs (CBGs transmitted on the punctured resources in the $1^{st}$ Tx 710) are retransmitted in the retransmission 720. In accordance with one aspect, if the retransmission type indicator 726 indicates that the retransmission includes the full set of CBGs (e.g., retransmission indicator set to 1), the CBG list 724 should be interpreted to indicate the CBGs (that were likely corrupted due to resource puncturing) for which the corresponding LLRs (stored at the UE 404) should be nulled/reset. If the retransmission type indicator indicates that the retransmission includes partial CBG retransmission (e.g., only punctured CBGs), then the CBG list 724 should be interpreted to indicate the CBGs that are included in the retransmission 720. In the current example, from the retransmission type indicator 726 (which is set to 1), the UE 404 may understand that the full set of CBGs is retransmitted and thus the CBG list 724 indicates the CBGs for which the previously generated LLRs (from the decoding of CBGs from the $1^{st}$ Tx 710) should be nulled, e.g., the corresponding LLR buffers should be reset, because the CBGs were punctured and thus the previous LLRs are likely incorrect/erroneous. Thus, with the retransmission type indicator 726 included, on the UE side the interpretation of the CBG list 724 may not just depend anymore (unlike the other configurations discussed with reference to FIGS. 4-6) on the transmitted feedback (ACK or NACK), but rather on what the base station 402 indicates in the retransmission type indicator 726.

The UE 404 may proceed to decode the retransmitted set of CBGs but the UE 404 may void the previously generated LLRs for CBGs 5, 6 and 7 indicated by the CBG list 724 and not perform soft combining for the CBGs 5, 6, and 7. For other remaining CBGs (e.g., 0-4 and 8-11) the decoding of the retransmitted CBGs may include soft combining with previously generated LLRs corresponding to the CBGs which were not affected by resource puncturing in the $1^{st}$ transmission 710. That is, for more reliable decoding, the UE 404 may perform soft combining of currently computed LLRs (generated as part of decoding the CBGs included in the retransmission 720) for CBGs 0-4 and 8-11 and the previously generated LLRs for the same CBGs. For example, soft combining for CBG 1 may include combining the previously generated LLRs for CBG 1 (from the decoding of CBG 1 from the $1^{st}$ transmission 710) with the currently generated LLRs for CBG 1 (from the decoding of CBG 1 from the retransmission 720). The technique of soft combining LLRs for reliable decoding are well understood by persons of skill in the art and thus need not be discussed herein in detail.

Figure 8:
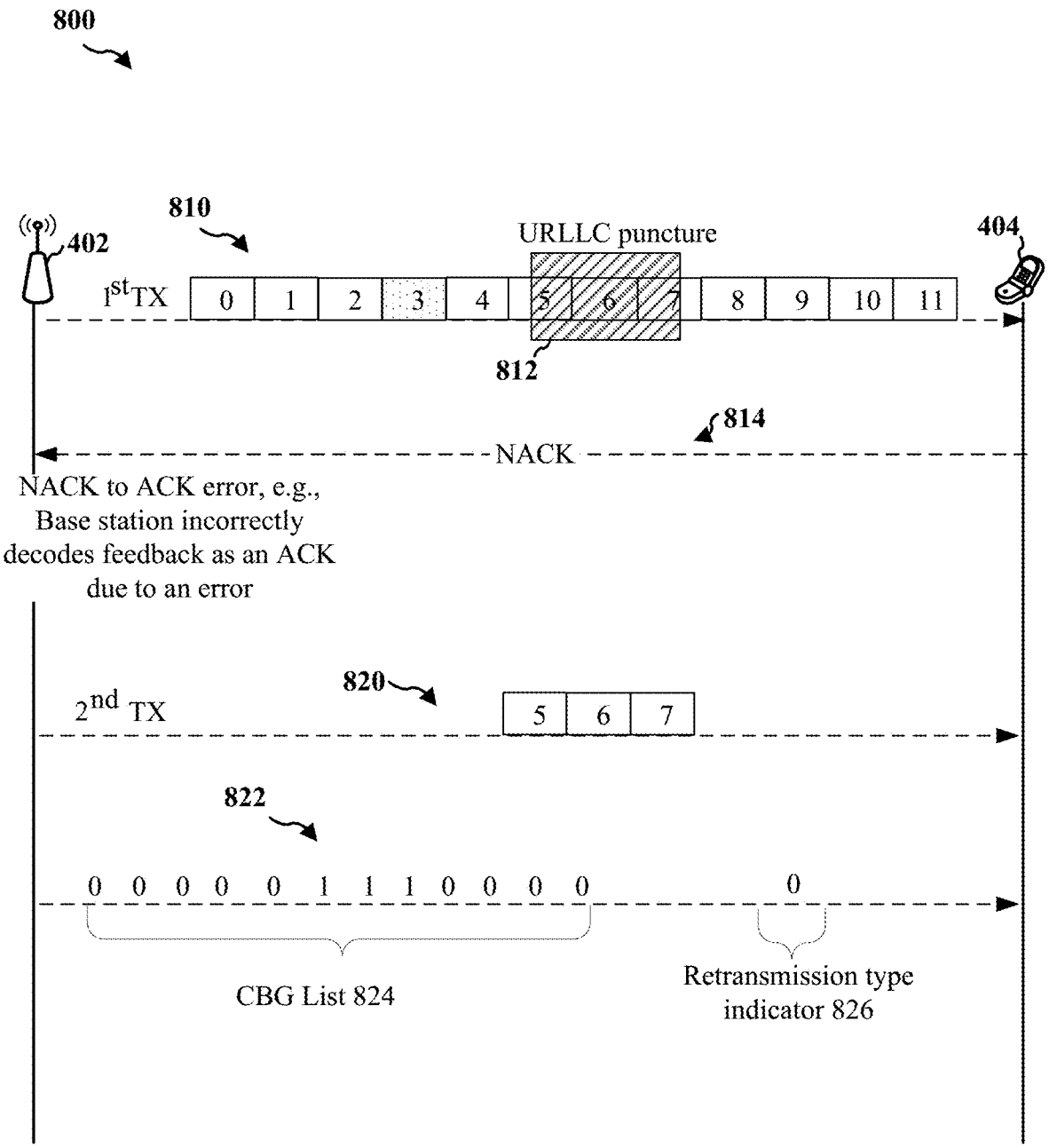
FIG. 8 illustrates another example showing signaling between the base station and the UE where a NACK to ACK error occurs, e.g., where a transmitted NACK is incorrectly interpreted by the base station as an ACK due to a receiving/decoding error.

A NACK to ACK error case may be considered in a similar manner. FIG. 8 includes a drawing 800 illustrating an example where a NACK to ACK error occurs, e.g., where the base station 402 incorrectly interprets a transmitted NACK as an ACK due to a receiving/decoding error. In the example, the UE 404 may receive a first ($1^{st}$) transmission 810 from the base station 402 including the set of CBGs 0 to 11. The base station 402 may also send a URLLC indication 812 of the URLLC puncturing indicating the punctured resources. For discussion purposes, consider that the indication 812 is correctly received and read by the UE 404. The UE 404 may proceed to decode the received CBGs, and in the example assume that decoding fails for at least one CBG on non-punctured resources (e.g., resources not indicated by the URLLC indication 812 as punctured resources). That is, at least one non-punctured CBG (for example, CBG 3) fails to decode at the UE 404. Thus, in accordance with the aspects discussed earlier (e.g., as discussed with respect to FIG. 5), in such a case the UE 404 may send a NACK 814 to indicate that at least one CBG, in addition to the CBGs on punctured resources, failed to decode. In the example, consider that the base station 402 receives the NACK 814, but due to an error, the base station 402 incorrectly reads the received feedback as an ACK instead of the intended NACK. Consequently, in contrast to the intended meaning of the NACK 814, the base station 402 interprets the feedback 814 as an ACK indicating that all CBGs, except the CBGs on punctured resources (i.e., CBGs 5-7), are successfully decoded and thus assumes that all CBGs on non-punctured resources are decoded successfully at the UE 404. Thus, due the NACK to ACK type error, rather than correctly understanding the need to retransmit the full set of CBGs, the base station 402 may misunderstand that only the punctured CBGs (CBGs 5-7) need to be retransmitted. With such misunderstanding, the base station 402 may proceed to send a retransmission 820 including a subset of CBGs transmitted in the previous transmission 810, e.g., only the CBGs 5-7. While the base station 402 retransmits only the CBGs 5-7, the UE 404, knowing that the UE 404 sent a NACK 814, may be expecting to receive the full set of CBGs, e.g., CBGs 0-11.

The base station 402 may also send a retransmission grant 822 including a CBG list 824 (including information from the earlier URLLC indication 812) indicating the affected CBGs. Again, to highlight/reiterate the problem/misunderstanding that may occur in such cases without the exemplary retransmission type indicator, it may be noted that from the perspective of the base station 402, the CBG list 824 is sent following/in response to an ACK (due to incorrect reception/decoding of the NACK by the base station 402) and indicates the CBGs that are retransmitted. However, from the perspective of UE 404, the CBG list 824 is received following/in response to the transmitted NACK 814 and the UE 404 may interpret such a CBG list as an indication of CBGs for which corresponding LLRs need to be voided while the UE 404 expecting that all CBGs are retransmitted. Once again, similar to the example of FIG. 7 it may be observed that a without a retransmission type indicator, a misinterpretation of the CBG list may occur (e.g., caused due to a NACK to ACK error). However, by including the retransmission type indicator 826 in the retransmission grant 822 in addition to the CBG list 824, such a misunderstanding of the CBG list 824 may be avoided in a similar manner as discussed in connection with FIG. 7 example. The retransmission type indicator 826 in the current example is set to "0" to explicitly indicate that the retransmission 820 includes only the punctured CBGs (CBGs transmitted on the punctured resources in the $1^{st}$ Tx 810). Based on the retransmission type indicator 826 (set to "0"), the UE 404 may determine that only the punctured CBGs are retransmitted in the retransmission 820, and the CBG list 824 indicates the CBGs that are included in the retransmission 820. Furthermore, from the CBG list 824 and based on the prior determination by UE 404 from the previous decoding, the UE 404 may determine that the non-punctured CBG (CBG 3 in this example) which failed decoding in the last round (i.e., when decoding CBGs of the $1^{st}$ Tx 810) has not been retransmitted. Thus the UE 404 may report another NACK to the base station 402 to request a full TB retransmission. While there may be some inefficiency in this approach due another retransmission, the issue of misunderstanding/misinterpretation of the CBG list is avoided and no error is propagated.

Figure 9:
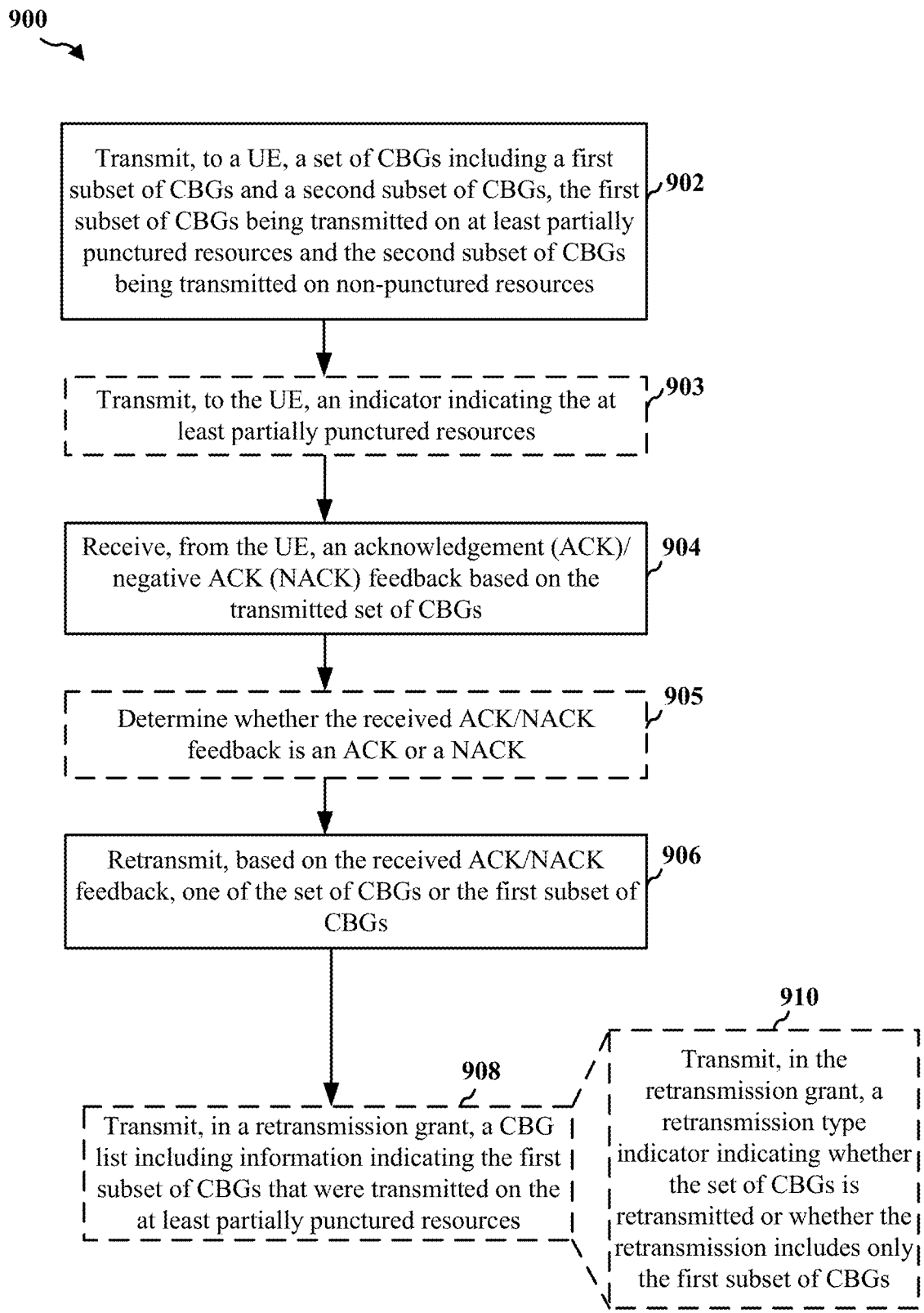
FIG. 9 is a flowchart of a method of wireless communication of a base station.

FIG. 9 is a flowchart 900 of a method of wireless communication. The method of flowchart 900 may be performed by a base station (e.g., the base station 180, 102, 310, 402, the apparatus 1102/1102'). At 902, the base station may transmit, to a UE, a TB comprising a set of CBGs including a first subset of CBGs and a second subset of CBGs, where the first subset of CBGs may be transmitted on at least partially punctured resources and the second subset of CBGs may be transmitted on non-punctured resources. The TB may originally be an eMBB TB, that is, a transport block carrying eMBB data. However in order to communicate delay sensitive URLLC data the base station may puncture/preempt some resources carrying eMBB data CBGs to carry the URLLC data. For example, referring to FIGS. 4, 5, 7 and 8, the base station 402 may transmit a TB including the set of CBGs 0-11, where the CBGs 5-7 (e.g., first subset) occupy resources that are at least partially punctured (e.g., for carrying URLLC data), while the CBGs 0-4 and 8-11 (second subset) occupy non-punctured resources.

At 903, the base station may transmit an indicator indicating the at least partially punctured resources to the UE. In some configurations, the base station may send (e.g., transmit) the indicator indicating the at least partially punctured resources in an indication channel. For example, in some configurations, the indicator may be transmitted by the base station in a PDCCH. In some configurations, the indicator may be transmitted concurrently with an initial transmission of the set of CBGs, or before or after the initial transmission of the set of CBGs. For example, referring to FIG. 5, the base station 402 may transmit a URLLC indication 512 indicating the punctured resources in an indicator channel. The transmission of the indicator may allow the UE receiving the first transmission including the set of CBGs to determine the punctured resources and in turn also determine which of the received CBGs may have been corrupted/affected due to the resource puncturing.

At 904, the base station may receive, from the UE, one of an ACK feedback or a NACK feedback based on the transmitted set of CBGs. In accordance with an aspect of some configurations, the ACK feedback may indicate that the CBGs in the second subset of CBGs are successfully decoded. That is, in some configurations, based on an understanding between the base station and the UE, the ACK may be interpreted to indicate that all CBGs except the CBGs that were transmitted on partially punctured resources were successfully decoded at the UE. In some configurations, the NACK feedback may indicate that some CBGs in the second subset of CBGs failed decoding at the UE, i.e., at least one CBG other than the CBGs that were transmitted on partially punctured resources failed decoding at the UE. For example, referring to FIGS. 4-5, the base station 402 may receive a HARQ ACK (e.g., ACK 414) or a HARQ NACK (e.g., NACK 514) from the UE 404 based on whether UE 404 is able to decode all but the punctured CBGs of the $1^{st}$ Tx (410/510). The base station may receive the ACK/NACK feedback as ACK 414 when all CBGs in the received set of CBGs, except the first subset of CBGs (on punctured resources), are successfully decoded at the UE and may receive the feedback as NACK 514 when at least one CBG in the second subset of CBGs (transmitted on non-punctured resources) fails decoding at the UE. In some configurations, the ACK/NACK feedback is a single bit feedback.

At 905, the base station may determine whether the received single bit ACK/NACK feedback is an ACK or a NACK. For example, based on the value of the single bit the base station may determine if the received ACK/NACK feedback is an ACK or a NACK. For example, if the ACK/NACK bit value is set to "1", the base station may determine that the received ACK/NACK feedback is an ACK and if is determined that the ACK/NACK bit value is set to "0", the base station may determine that the received ACK/NACK feedback is an NACK.

At 906, the base station may retransmit, based on the received ACK/NACK feedback, one of the set of CBGs (e.g., full set of CBGs of the TB transmitted in the $1^{st}$ transmission) or the first subset of CBGs (e.g., only the CBGs that were on partially punctured resources in the $1^{st}$ transmission). For example, again referring to FIGS. 4-5, based on whether the ACK (414) or the NACK (514) is received by the base station 402, the base station 402 may determine whether the entire TB (e.g., set of CBGs 0-11 of the $1^{st}$ Tx 410/510) needs to be retransmitted, or a subset of the entire TB (e.g., such as the first subset of CBGs including CBGs 5-7 which were on punctured resources) need to be retransmitted. Based on the determination, the base station 402 may retransmit (420) the set of CBGs (e.g., CBGs 0-11 when the received feedback is a NACK) or the first subset of CBGs (e.g., CBGs 5-7 when the received feedback is an ACK). Thus, in accordance with an aspect, in some configurations, the set of CBGs is retransmitted when the received ACK/NACK feedback is a NACK, whereas the first subset of CBGs is retransmitted when the received ACK/NACK feedback is an ACK. As discussed supra, from the perspective of the base station a received ACK may be indicative of a successfully decoding by the UE of all CBGs, except the first subset of CBGs transmitted on the at least partially punctured resources. Similarly, a received NACK may indicate that at least one CBG in the second subset of CBGs failed decoding at the UE. In some configurations, the first subset of CBGs may be retransmitted on a set of resources corresponding to a mini-slot of a subframe. The set of resources may correspond a set of OFDM symbols of the mini-slot of the subframe.

At 908, the base station may transmit, in a retransmission grant, a CBG list (also referred to herein as CBG confirmation) indicating one or more CBGs that were transmitted on the at least partially punctured resources in the $1^{st}$ transmission. That is, the CBG list may indicate the first subset of CBGs that were transmitted on the at least partially punctured resources. For example, referring to FIG. 7, the base station 402 may transmit, in the retransmission grant 722, the CBG list 724 including information, e.g., a CBG mask/bitmap "000001110000" indicating the CBGs that were transmitted on punctured resources in the original transmission ($1^{st}$ Tx 710). In some configurations, the CBG list may be based on the information included in a previously transmitted indicator (e.g., URLLC indication 712) indicating the punctured resources. While the operation of transmission of the retransmission grant is illustrated at 908 following the block 906, in some configurations the retransmission grant may be transmitted concurrently with the retransmission. However, the retransmission grant may be transmitted in a control channel, e.g., PDCCH, which is different than the channel that carries the retransmission of one or more CBGs. In some configurations, the retransmission grant may further include a retransmission type indicator (e.g., such as indicator 726/826) indicating whether the retransmission includes the set of CBGs or the first subset of CBGs. Thus, as illustrated at 910, the base station may transmit, in the retransmission grant, a retransmission type indicator indicating whether the set of CBGs is retransmitted or whether the retransmission includes only the first subset of CBGs. For example, referring again to FIG. 7, the retransmission grant 722 may include the retransmission type indicator 726 in addition to the CBG list 724. In an aspect, the base station 402 may include the retransmission type indicator 726 in the retransmission grant 722 to explicitly indicate to the UE 404 whether the associated retransmission 720 includes the entire TB (e.g., full set of CBGs) or only the failed CBGs to avoid confusion/misunderstanding at the UE. The reasons, various features and/or advantages related to transmission of a retransmission type indicator in a retransmission grant are discussed in greater detail in connection with FIGS. 7-8.

In various configurations, the base station may transmit (e.g., as a unicast or broadcast) the indicator indicating the punctured resources (discussed in connection with operation block 903) in an indicator channel, prior to the retransmission grant. For example, with reference to FIG. 4/5, the indicator 412/512 may be transmitted concurrently with an initial transmission (e.g., the $1^{st}$ Tx 410/510). In some configurations, the indicator 412/512 may be transmitted by the base station in a PDCCH. In some configurations, where the UE receives the indicator, the ACK feedback may indicate that all CBGs except the CBGs transmitted on the punctured resources indicated by the indicator are successfully decoded. In some such configurations, the NACK feedback may indicate that at least one CBG other than the CBGs that were transmitted on punctured resources indicated by the indicator failed decoding.

Figure 10:
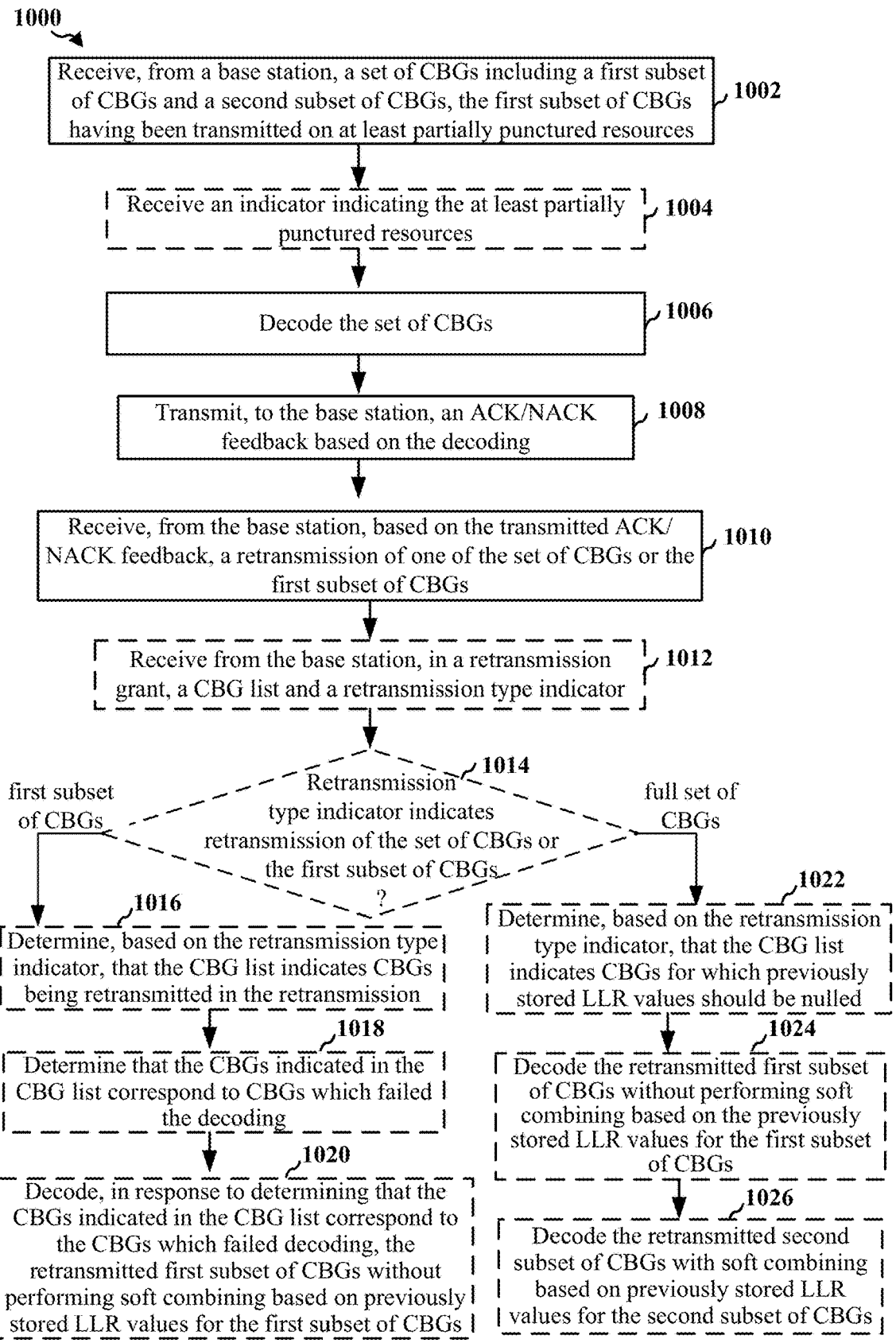
FIG. 10 is a flowchart of a method of wireless communication of a UE.

FIG. 10 is a flowchart 1000 of a method of wireless communication. The method of flowchart 1000 may be performed by a UE (e.g., the UE 104, 350, 404, 1150, 1302, 1302'). At 1002, the UE may receive a set of CBGs including a first subset of CBGs and a second subset of CBGs from a base station, the first subset of CBGs having been transmitted by the base station on at least partially punctured resources (e.g., eMBB resources that may have been punctured/preempted to carry URLLC data). For example, referring to FIG. 4, the UE 404 may receive a TB of the set of CBGs (CBGs 0-11) from the base station 402 where one subset (e.g., CBGs 5, 6, 7) of the set CBGs may have been transmitted on at least partially punctured resources while another subset (e.g., CBGs 0-4 and 8-11) on non-punctured resources.

At 1004, the UE may receive an indicator (also referred to as the preemption indicator) indicating the at least partially punctured resources from the base station. In some configurations, the indicator indicating the at least partially punctured resources may be received in an indication channel, e.g., in the PDCCH. For example, referring to FIG. 4/5, the UE 404 may receive a URLLC indication 412/512 indicating the punctured resources. The received indicator may allow the UE 404 to determine the punctured resources on which the first subset of CBGs is transmitted by the base station 402 (and received by the UE 404) and in turn also determine which CBGs of the received set of CBGs may have been corrupted/affected due to the resource puncturing. In other words, the indicator may allow the UE 404 to determine which CBGs correspond to the first subset.

At 1006, the UE may decode the set of CBGs received from the base station. For example, again referring to FIG. 4/5, the UE 404 may decode the received set of CBGs or at least some of the received CBGs and decide whether to send an ACK or a NACK feedback based on a result of the decoding. For example, in some configurations, each CBG may be decoded independently, e.g., separately. In some configurations, the UE may be configured to decode the full set of CBGs. After or as part of the decoding, the UE may run a CRC to determine whether the decoding of the CBGs has been successful. For example, a decoded CBG for which CRC passes may be considered to be successfully decoded whereas the CBG for which such a CRC fails may be considered to have failed decoding. As discussed supra, since the first subset of CBGs is on punctured/partially punctured resources, the decoding for the first subset of CBGs may likely fail.

At 1008, the UE may transmit, to the base station, an ACK/NACK feedback based on the decoding. In some configurations, the ACK/NACK feedback is a single bit indicator. As discussed earlier in detail, in some configurations, the UE 404 may send an ACK feedback when all CBGs in the received set of CBGs, except the first subset of CBGs, are successfully decoded at the UE 404. That is, in some configurations, the UE may be configured to send an ACK when all CBGs except the CBGs transmitted on the punctured resources are successfully decoded. The UE may be further configured to send a NACK feedback when at least one CBG in the second subset (e.g., the subset of CBGs transmitted by the base station on non-punctured resources) of CBGs fails decoding at the UE. For example, as discussed with respect to FIG. 5, the UE 404 may be configured to report a NACK when one or more CBGs on non-punctured resources (e.g., from CBGs 0-4 and 8-11) fail decoding. In some configurations, the transmitting of the ACK/NACK feedback may be further based on the received indicator indicating the at least partially punctured resources. For example in one configuration, having decoded the received CBGs, the UE may determine based on the indicator (discussed at 1004 above) whether the CBGs that failed decoding correspond to and/or are the same as the first subset of CBGs that were received from the base station on punctured/ partially punctured resources. If the CBGs that failed decoding are limited to the ones in the first subset of CBGs, the UE transmit an ACK. If the CBGs that failed decoding include one or more additional CBGs besides the ones that are on partially punctured resources then the UE may transmit a NACK.

At 1010, the UE may receive from the base station, based on the transmitted ACK/NACK feedback, a retransmission of one of the set of CBGs or the first subset of CBGs. In other words, the UE may either receive a retransmission of either the full set of CBGs or just the first subset of CBGs that was received on punctured resources from the base station in the first transmission from the base station. For example, with reference to FIG. 4, it may be appreciated that the UE 404 may receive a retransmission of just the subset (e.g., CBGs 5-7) of the originally transmitted set of CBGs when an ACK feedback (e.g., ACK 414) is reported by the UE 404. Similarly, with reference to FIG. 5, the UE 404 may receive a retransmission of the entire TB including the full set of CBGs (e.g., CBGs 0-11) when a NACK feedback (e.g., NACK 514) is reported by the UE 404.

At 1012, the UE may receive, in a retransmission grant, a CBG list. The CBG list may indicate one or more CBGs, of the set of CBGs, that were received from the base station on the at least partially punctured resources in the previous transmission. For example, the CBG list may identify the CBGs of the first subset, i.e., the CBGs that were that were transmitted by the base station on the punctured/partially punctured resources. In addition, in some configurations, the retransmission grant may further include a retransmission type indicator (e.g., indicator 726/826). The retransmission type indicator may indicate whether the retransmission includes the set of CBGs or the first subset of CBGs. For example, referring to FIG. 7, the UE 404 may receive the CBG list indicating the CBGs that were transmitted on punctured/partially punctured resources in the 1$^{st}$ Tx 710. In some configurations, the CBG list may be based on information included in the preemption indicator (e.g., URLLC indication 412/512/612/712) indicating the punctured resources. For example, the CBG list may identify the CBGs that were transmitted on the punctured resources indicated by the preemption indicator. Because the CBG list is based on the previously sent preemption indicator, the CBG list may, in a way, serve as a reconfirmation of the UE's understanding of the CBGs that were received on punctured/ partially punctured resources. Furthermore, in accordance with the described aspects, the CBG list may be interpreted by the UE to indicate the CBGs for which previously stored LLRs should be nulled by the UE because the LLRs corresponding to the CBGs of the CBG list may be erroneous/ incorrect, e.g., due to resource puncturing. As discussed in greater detail with respect to FIGS. 7-8, in accordance with an aspect, the UE may use the retransmission type indicator received in the retransmission grant to properly interpret the CBG list rather than interpreting the CBG list based on whether an ACK or NACK was transmitted by the UE which may lead to confusion in some cases. As discussed earlier, the use of retransmission type indicator may allow avoiding/ eliminating a misunderstanding/misinterpretation of the received retransmission and the CBG list by the UE. This may be particularly useful in cases of ACK to NACK error or NACK to ACK error as discussed in detail in connection with FIGS. 7-8.

In one configuration, at 1014, the UE may determine whether the retransmission type indicator indicates that the retransmission includes the full set of CBGs (e.g., retransmission type indicator set to 1) or the first subset of CBGs (e.g., retransmission type indicator set to 0). Based on the determination at 1014, the operation may proceed along one of the two paths illustrated in the flowchart. If the retransmission type indicator indicates that the retransmission includes only the first subset of CBGs, the operation proceeds to block 1016. Because the retransmission type indicator indicates that only the first subset of CBGs is retransmitted, at 1016, the UE may interpret the CBG list to indicate CBGs included in the retransmission, i.e., the retransmitted CBGs received at the UE. Next at 1018, the UE may determine that the CBGs indicated in the CBG list correspond to CBGs which failed the decoding (performed at 1006). For example, the UE may compare the CBGs identified in the CBG list with the information regarding CBGs that failed decoding that may be available to the UE based on the stored results of the previously performed decoding. When the retransmitted CBGs are the same as the CBGs that failed decoding (e.g., the first subset of CBGs that were transmitted on punctured resources), at 1020 the UE may decode the retransmitted first subset of CBGs without performing soft combining based on previously stored LLR values for the first subset of CBGs. For example, the UE may reset the LLR buffers that store the previously generated LLRs corresponding to the first subset of CBGs because the UE knows the first subset of CBGs was transmitted on punctured resources and the previously generated LLRs may therefore be erroneous. The UE may then proceed to decode the retransmitted first subset of CBGs. While the UE may generate LLRs for the received (retransmitted) first subset of CBGs, but may not soft combine the currently generate LLRs with the previously stored LLRs. By avoiding soft combining based on the previously stored LLRs for the first subset of CBGs (that may be likely erroneous due to resource puncturing), propagation of decoding errors may be reduced or eliminated. If the decoding (1020) fails (e.g., a CRC fails) for one or more CBGs of the first subset of CBGs, the UE may send an ACK again to request retransmission of the first subset of CBGs.

Referring back to 1014, if the retransmission type indicator indicates that the retransmission includes the full set of CBGs (i.e., all CBGs are retransmitted), the operation may proceed to block 1022. At 1022, the UE may determine, based on the retransmission type indicator, that the CBG list indicates CBGs for which previously stored LLR values should be nulled. As discussed earlier in detail with respect to FIGS. 7-8, in some configurations the UE may interpret the CBG list and the content of the retransmission based on the retransmission type indicator and not based on whether the retransmission is in response to an ACK or NACK. Because the retransmission type indicator indicates that the full set of CBGs is retransmitted, the UE may understand that the CBG list indicates the CBGs for which previously stored LLR values should be nulled by the UE (and not what the retransmission includes). Thus, because the CBG list indicates the first subset of CBGs transmitted on the partially punctured resources, the UE may reset the LLR buffers that store the previously generated LLRs corresponding to the first subset of CBGs thereby nulling out the previously stored LLRs corresponding to the first subset of CBGs. Next at 1024, the UE may decode the retransmitted first subset of CBGs without performing soft combining based on the previously stored LLR values (which are nulled out instead as discussed above) corresponding to the first subset of CBGs. Thus, in accordance with an aspect, such decoding purposely avoids soft combining based on the previously stored LLRs corresponding to the first subset of CBGs because the previously generated LLRs for the first subset of CBGs are likely erroneous/incorrect because of the resource puncturing. Next at 1026, the UE may decode the retransmitted second subset of CBGs of the retransmitted set of CBGs with soft combining based on previously stored LLR values for the second subset of CBGs. Since the second subset of CBGs was on non-punctured resources in the first transmission, the previously stored LLR values for the second subset of CBGs (e.g., which maybe generated by the UE following the receipt of the second subset of CBGs in the first transmission) are considered to be correct and reliable. Thus, for improved (e.g., more accurate and reliable) decoding, the UE may decode the retransmitted second subset of CBGs by performing soft combining based on previously stored LLR values for the second subset of CBGs. For example, the UE may generate LLRs corresponding to the retransmitted second subset of CBGs and soft combine the currently generated LLRs for the retransmitted second subset of CBGs with the previously stored LLR values for the second subset of CBGs, and decode the retransmitted second subset of CBGs based on the combined LLRs.

If the decoding (1024) of the retransmitted first subset of CBGs fails for one or more CBGs of the first subset fails the UE may send an ACK again to request retransmission of the first subset of CBGs. If the decoding (1026) fails for one or more CBGs of the retransmitted second subset of CBGs, the UE may send a NACK again to request retransmission of the full set of CBGs.

Figure 11:
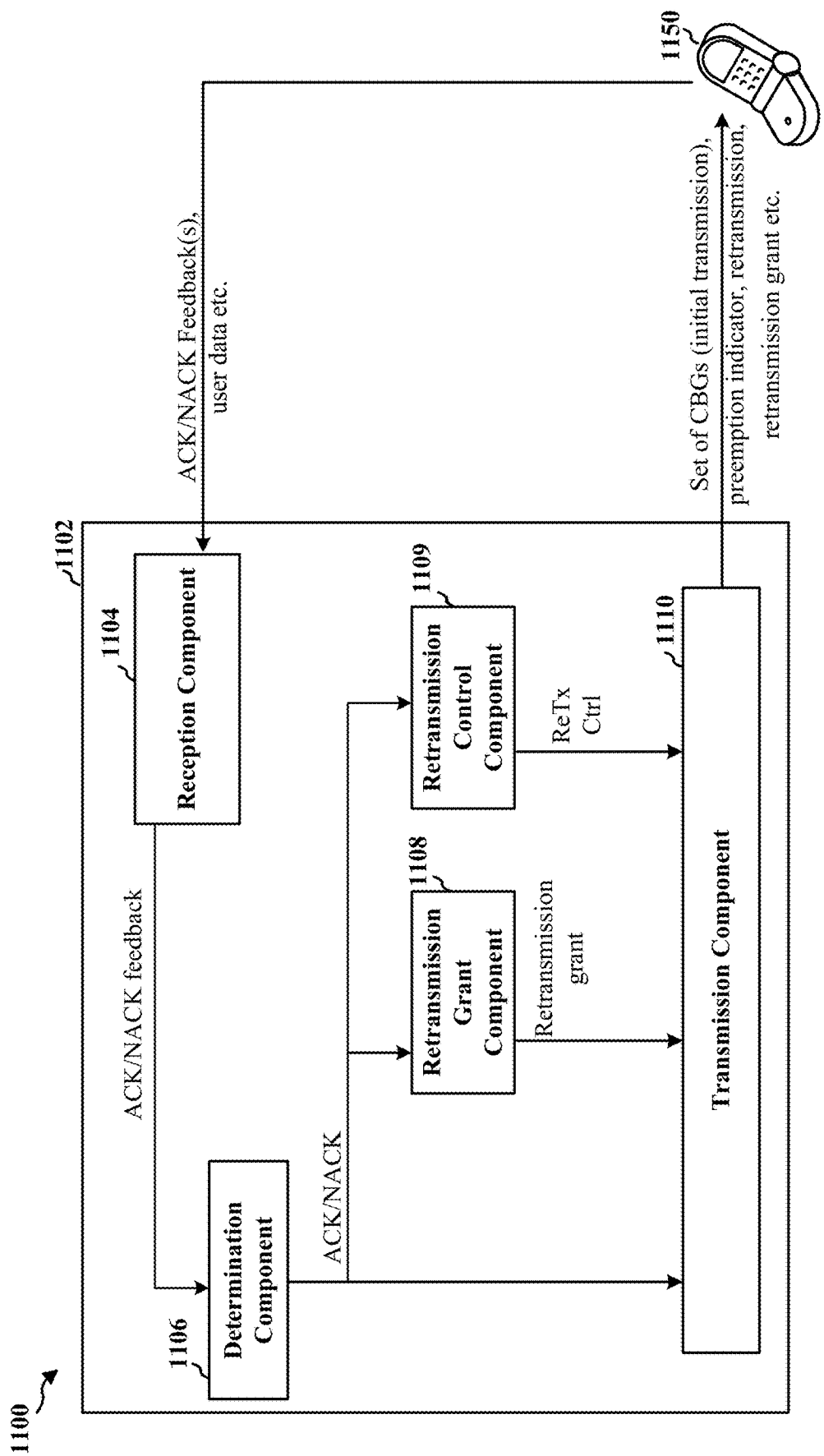
FIG. 11 is a conceptual data flow diagram illustrating the data flow between different means/components in an exemplary apparatus.

FIG. 11 is a conceptual data flow diagram 1100 illustrating the data flow between different means/components in an example apparatus 1102. The apparatus 1102 may be a base station (e.g., such as base station 102, 180, 310, 402, 1350). The apparatus 1102 may include a reception component 1104, a determination component 1106, a retransmission grant component 1108, a retransmission control component 1109, and a transmission component 1110.

The transmission component 1110 may be configured to transmit data and/or other control information to one or more external devices, e.g., including UE 1150. In some configurations, the transmission component 1110 may be configured to transmit, to the UE 1150, a TB including a set of CBGs including a first subset of CBGs and a second subset of CBGs, where the first subset of CBGs is transmitted on at least partially punctured resources and the second subset of CBGs is transmitted on non-punctured resources. For example, with reference to FIGS. 4-5, the base station 402 may transmit a TB including a set of 12 CBGs to the UE 404, e.g., in an initial transmission 410/510, where the set of the CBGs include a first set of CBGs {5, 6, 7} transmitted on at least partially punctured resources, and a second subset of CBGs {0, 1, 2, 3, 4, 8, 9, 10, 11} transmitted on non-punctured resources. In some configurations, the transmission component 1110 may be further configured to transmit an indicator indicating the at least partially punctured resources to the UE 1150. In some configurations, the indicator indicating the at least partially punctured resources may be transmitted in an indication channel, e.g., in a control block of a channel such as PDCCH. For example, with reference to FIG. 5 the transmitted indicator indicating the at least partially punctured resources may comprise the URLLC indication 512. In some configurations, the transmission component 1110 may include a preemption indicator generator configured to generate the indicator.

The reception component 1104 may be configured to receive messages and/or other information from other devices including, e.g., UE 1150. The signals/information received by the reception component 1104 may be provided to one or more components of the apparatus 1102 for further processing and use in performing various operations in accordance with the methods discussed supra including the method of flowchart 900. In some configurations, the reception component 1104 may receive, from the UE 1150, a ACK/NACK feedback based on the transmitted set of CBGs. For example, with reference to FIGS. 4-5, the apparatus 1102 may be the base station 402 and via the reception component 1104 a HARQ ACK (e.g., ACK 414) or a HARQ NACK (e.g., NACK 514) may be received from the UE 404 in response to the initially transmitted CBGs, e.g., based on whether UE 404 is able to decode all but the punctured CBGs of the $1^{st}$ Tx (410/510). In some configurations, reception component 1104 may process (e.g., decode, recover, and/or reformat) the received ACK/NACK feedback and forward the processed ACK/NACK feedback to the determination component 1106. Thus the reception component 1104 may include a decoder for decoding the received ACK/NACK feedback and other received messages. The determination component 1106 may be configured to determine whether the received ACK/NACK feedback is an ACK or a NACK. For example, the received ACK/NACK feedback may be a single bit feedback and based on the value of the single bit (e.g., 1 or 0) the determination component 1106 may determine if the received ACK/NACK feedback is an ACK or a NACK. The determination component 1106 may be further configured to provide the result of the determination to one or more other components, e.g., components 1108 and/or 1109 and/or 1110, to allow such components to take action in accordance with the features of the disclosed methods.

In one configuration, the transmission component 1110 alone, in combination with and/or under the control of the retransmission control component 1109, may be further configured to retransmit one of the set of CBGs (e.g., full set of CBGs of the TB transmitted in the initial transmission) or the first subset of CBGs, based on the received ACK/NACK feedback. The retransmission grant component 1108 may be configured to generate a retransmission grant including a CBG list (also referred to herein as CBG confirmation) indicating the first subset of CBGs that were transmitted on the at least partially punctured resources. In some configurations, the CBG list may be based on the information included in the previously transmitted indicator (also referred to herein as the preemption indicator and/or URLLC indication) that indicates the at least partially punctured resources. In some configurations, the retransmission grant may further include a retransmission type indicator indicating whether the set of CBGs is retransmitted or whether the retransmission includes only the first subset of CBGs.

The transmission component 1110 alone, in combination with and/or under the control of the retransmission control component 1109, may be further configured to transmit the retransmission grant including the CBG list indicating the first subset of CBGs that were transmitted on the at least partially punctured resources to the UE 1150. The retransmission control component 1109 may be configured to control the transmission component 1110 and/or elements of the apparatus 1102 to perform the retransmission related operations in accordance with the features of the above discussed methods.

The apparatus may include additional components that perform each of the blocks of the algorithm in the aforementioned flowchart of FIG. 9. As such, each block in the aforementioned flowchart of FIG. 9 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 12:
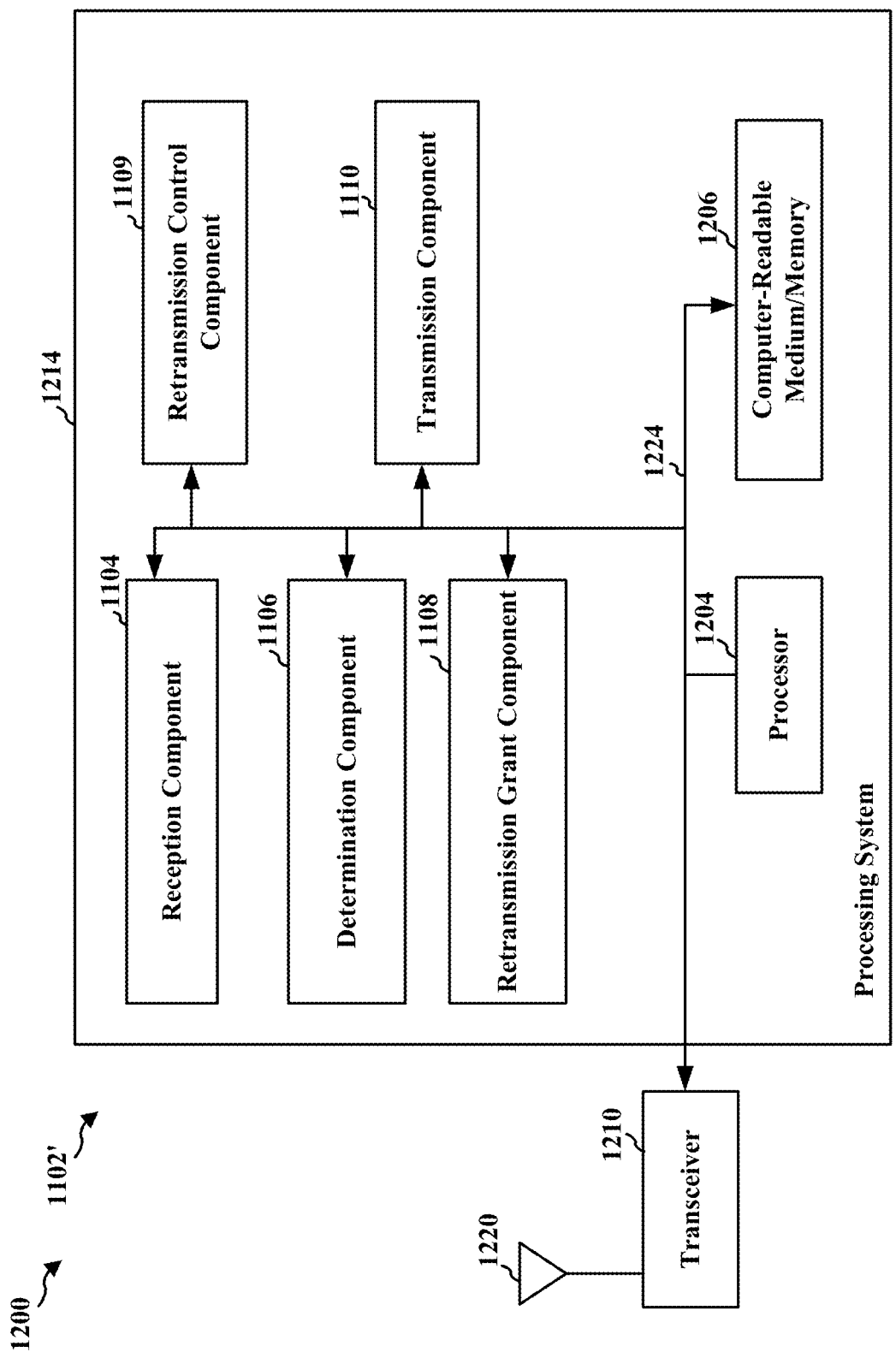
FIG. 12 is a diagram illustrating an example of a hardware implementation for an apparatus employing a processing system.

FIG. 12 is a diagram 1200 illustrating an example of a hardware implementation for an apparatus 1102' employing a processing system 1214. The processing system 1214 may be implemented with a bus architecture, represented generally by the bus 1224. The bus 1224 may include any number of interconnecting buses and bridges depending on the specific application of the processing system 1214 and the overall design constraints. The bus 1224 links together various circuits including one or more processors and/or hardware components, represented by the processor 1204, the components 1104, 1106, 1108, 1109, 1110 and the computer-readable medium/memory 1206. The bus 1224 may also link various other circuits such as timing sources, peripherals, voltage regulators, and power management circuits, which are well known in the art, and therefore, will not be described any further.

The processing system 1214 may be coupled to a transceiver 1210. The transceiver 1210 is coupled to one or more antennas 1220. The transceiver 1210 provides a means for communicating with various other apparatus over a transmission medium. The transceiver 1210 receives a signal from the one or more antennas 1220, extracts information from the received signal, and provides the extracted information to the processing system 1214, specifically the reception component 1104. In addition, the transceiver 1210 receives information from the processing system 1214, specifically the transmission component 1110, and based on the received information, generates a signal to be applied to the one or more antennas 1220. The processing system 1214 includes a processor 1204 coupled to a computer-readable medium/memory 1206. The processor 1204 is responsible for general processing, including the execution of software stored on the computer-readable medium/memory 1206. The software, when executed by the processor 1204, causes the processing system 1214 to perform the various functions described supra for any particular apparatus. The computer-readable medium/memory 1206 may also be used for storing data that is manipulated by the processor 1204 when executing software. The processing system 1214 further includes at least one of the components 1104, 1106, 1108, 1109, and 1110. The components may be software components running in the processor 1204, resident/stored in the computer-readable medium/memory 1206, one or more hardware components coupled to the processor 1204, or some combination thereof. The processing system 1214 may be a component of the base station 310 and may include the memory 376 and/or at least one of the TX processor 316, the RX processor 370, and the controller/processor 375.

In one configuration, the apparatus 1102/1102' for wireless communication includes means for transmitting a TB comprising a set of CBGs including a first subset of CBGs and a second subset of CBGs, the first subset of CBGs being transmitted on at least partially punctured resources and the second subset of CBGs being transmitted on non-punctured resources. The TB comprising a set of CBGs may be transmitted to a UE. In some configurations, the apparatus 1102/1102' may further include means for receiving a ACK/NACK feedback based on the transmitted set of CBGs from the UE. In some configurations, the apparatus 1102/1102' may further include means for retransmitting, based on the received ACK/NACK feedback, one of the set of CBGs or the first subset of CBGs only. In some configurations, the means for retransmitting may be configured to retransmit the first subset of CBGs on a set of resources corresponding to a mini-slot of a subframe.

In some configurations, the means for transmitting may be further configured to transmit, in a retransmission grant, a CBG list including information indicating the first subset of CBGs that were transmitted on the at least partially punctured resources. In some configurations, the retransmission grant may further include a retransmission type indicator indicating whether the set of CBGs is retransmitted or whether the retransmission includes only the first subset of CBGs. In some configurations, the means for transmitting may be further configured to transmit, to the UE, an indicator indicating the at least partially punctured resources. In some configurations, the CBG list may be based on information included in the indicator, and the means for transmitting may be configured to transmit the indicator indicating the at least partially punctured resources prior to the transmission of the CBG list in the retransmission grant.

The aforementioned means may be one or more of the aforementioned components of the apparatus 1102 and/or the processing system 1214 of the apparatus 1102' configured to perform the functions recited by the aforementioned means. As described supra, the processing system 1214 may include the TX Processor 316, the RX Processor 370, and the controller/processor 375. As such, in one configuration, the aforementioned means may be the TX Processor 316, the RX Processor 370, and the controller/processor 375 configured to perform the functions recited by the aforementioned means.

Figure 13:
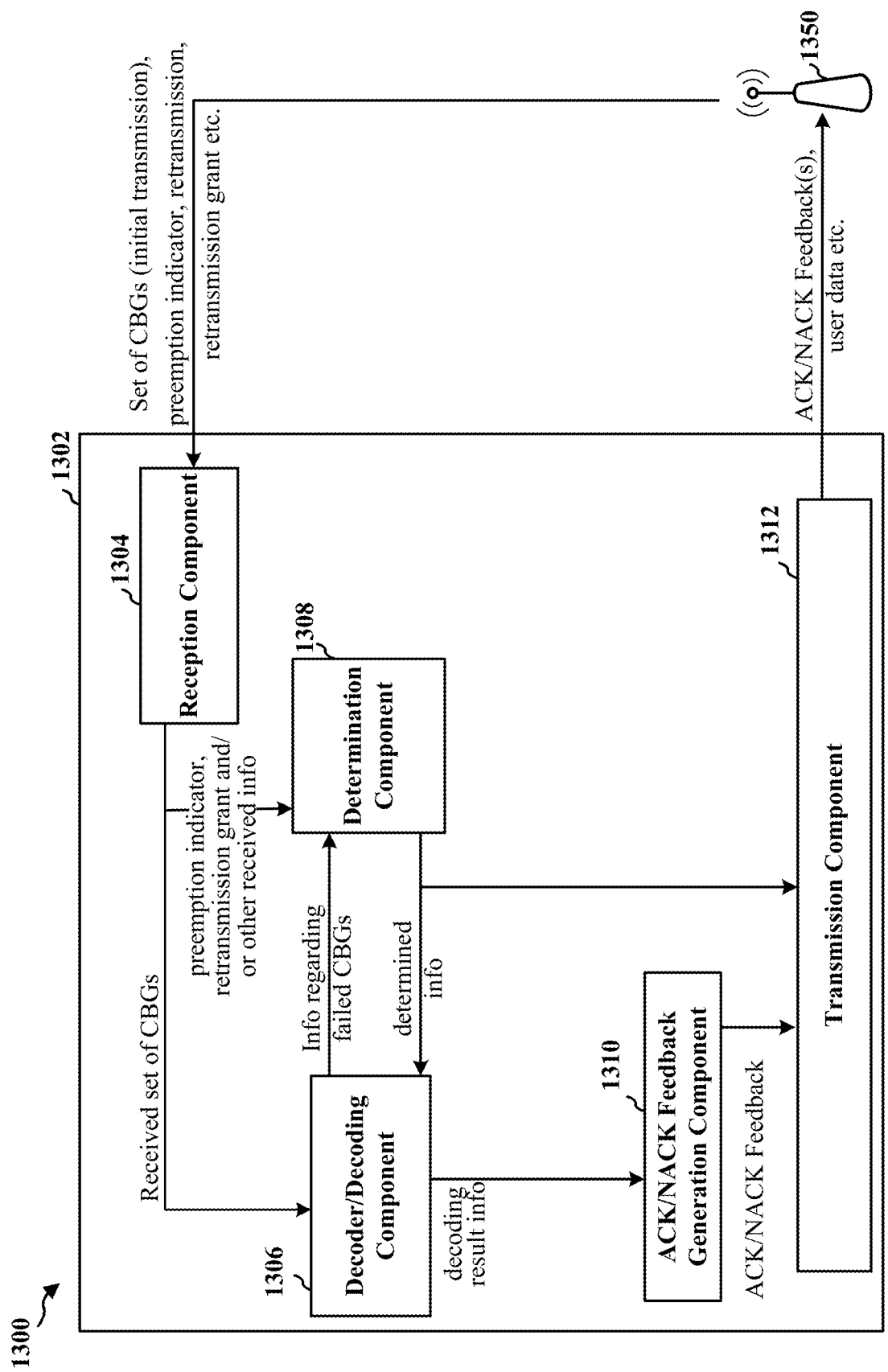
FIG. 13 is a conceptual data flow diagram illustrating the data flow between different means/components in another exemplary apparatus.

FIG. 13 is a conceptual data flow diagram 1300 illustrating the data flow between different means/components in an example apparatus 1302. The apparatus 1302 may be a UE (e.g., such as UE 104, 350, 404, 1150). The apparatus 1302 may include a reception component 1304, a decoder/decoding component 1306, a decoding result determination component 1308, an ACK/NACK feedback generation component 1310, and a transmission component 1312.

The reception component 1304 may be configured to receive messages and/or other information from other devices including, e.g., base station 1350. The signals/information received by the reception component 1304 may be provided to one or more components of the apparatus 1302 for further processing and use in performing various operations in accordance with the methods discussed supra including the method of flowchart 1000. In some configurations, the reception component 1304 may receive, from a base station (e.g., base station 1350), a TB including a set of CBGs including a first subset of CBGs and a second subset of CBGs from a base station, the first subset of CBGs having been transmitted by the base station on at least partially punctured resources. In some configurations, the reception component 1304 may further receive an indicator (also referred to as the preemption indicator) indicating the at least partially punctured resources from the base station. For example, referring to FIG. 4/5, the received indicator may be the URLLC indication 412/512 indicating the punctured/partially punctured resources.

In some configurations, the reception component 1304 may further receive a retransmission of one of the set of CBGs or the first subset of CBGs (e.g., the subset of CBGs that were transmitted on punctured/partially punctured resources) from the base station 1350 from the base station based on a ACK/NACK feedback transmitted to the base station. In some configurations, the reception component 1304 may further receive a retransmission grant including a CBG list and a retransmission type indicator, where the CBG list may indicate the first subset of CBGs that were transmitted by the base station on the at least partially punctured resources (e.g., in the first/initial transmission) and the retransmission type indicator may indicate whether the retransmission includes the set of CBGs or the first subset of CBGs.

The decoder/decoding component 1306 may be configured to decode the coded data and/or other information received by the apparatus 1302 including, for example, the set of CBGs (received in the initial transmission), retransmitted first subset of CBGs, and/or retransmitted full set of CBGs. In some configurations, the decoding component 1306 may be implemented as part of the reception component 1304. The decoding component 1306 may be configured to determine, e.g., based on the result of the decoding, if the set of CBGs is successfully decoded or one or more CBGs failed decoding. In some configurations, the decoding component 1306 may include a CRC component to perform a CRC in order determine whether or not a CBG has been successfully decoded. In some configurations, the decoding component 1306 may be configured to generate LLRs for each of the received CBGs (e.g., for CBGs in an initial transmission as well as CBGs received in a retransmission) being decoded and store the generated LLRs in corresponding LLR buffers. The determined decoding result information, e.g., regarding the CBGs that failed decoding, may be provided to one or more other components (e.g., such as the ACK/NACK feedback generation component 1310 and the transmission component 1312) of the apparatus 1302.

The determination component 1308 may be configured to determine the at least partially punctured resources (on which the base station 1350 transmitted the first subset of CBGs) based on the received preemption indicator. The determination component 1308 may be further configured to determine which CBGs of the set of CBGs received in the TB correspond to the first subset and which correspond to the second subset, e.g., based on the preemption indicator by mapping which of the CBGs are received on the punctured/partially punctured resources indicated by the preemption indicator. The determination component 1308 may be further configured to determine, based on the received retransmission type indicator, whether the received the retransmission includes the set of CBGs or the first subset of CBGs as discussed with respect to FIGS. 7-10. In one configuration, when the retransmission type indicator indicates that the retransmission includes the first subset of CBGs only, the determination component 1308 may be configured to determine, based on the received retransmission type indicator, that the CBG list indicates the CBGs retransmitted by the base station 1350 in the retransmission. The determination component 1308 may be further configured to determine if the CBGs indicated in the CBG list correspond to CBGs which failed decoding, e.g., the CBGs that failed decoding among the set of CBGs received in the first transmission. For example, the determination component 1308 may be configured to compare the CBGs indicated in the CBG list with the CBGs that are determined to have failed decoding (based on information from decoder 1306), and determine if the two are the same. For example, with reference to FIG. 4, the CBG list may indicate CBGs {5, 6. 7} which forms the first subset of CBGs transmitted on punctured resources and in the example the UE 404 failed to decode CBGs {5, 6. 7}. In the example, based on such information known to the UE 404 from the CBG list and decoding result, whether the CBGs indicated in the CBG list correspond to CBGs which failed decoding may be determined. The result of determinations performed by the determination component 1308 may be provided to the decoder 1306 and/or other components for further use in performing further operations and/or actions. In some configurations, when the retransmission type indicator indicates the retransmission includes the set of CBGs, the determination component 1308 may be configured to determine that the CBG list indicates CBGs for which previously stored LLR values should be nulled. The determined information may be provided to the decoder 1306 which may null out the LLRs by resetting the LLR buffers.

In some configurations, the decoding component 1306 may be further configured to decode the retransmitted first subset of CBGs without performing soft combining based on previously stored LLR values for the first subset of CBGs, e.g., in response to determining that the CBGs indicated in the CBG list correspond to the CBGs which failed the decoding. In some configurations, when the retransmission includes the full set of CBGs, the decoding component 1306 may be configured to decode the retransmitted first subset of CBGs without performing soft combining based on the previously stored LLR values and decode the retransmitted second subset of CBGs, with soft combining based on previously stored LLR values for the second subset of CBGs.

The ACK/NACK feedback generation component 1310 may be configured to generate an ACK/NACK feedback based on decoding result received from the decoding component 1306. For example, the ACK/NACK feedback generation component 1310 may be configured to generate an ACK when all CBGs in the received set of CBGs, except the first subset of CBGs, are successfully decoded. The ACK/NACK feedback generation component 1310 may be configured to generate a NACK when at least one CBG in the second subset of CBGs fails decoding at the UE. The generated ACK/NACK feedback may be provided to the transmission component 1312 for transmission to the base station 1350.

The transmission component 1312 may be configured to transmit ACK/NACK feedback(s), user data and/or other information to one or more external devices, e.g., including base station 1350. In some configurations, the transmission component 1312 may be configured to transmit the ACK/NACK feedback(s) based on the decoding of the received CBGs in accordance with the methods disclosed supra. In one configuration, the transmission component 1312 may be configured to transmit an ACK feedback when all CBGs in the received set of CBGs, except the first subset of CBGs, are successfully decoded at the apparatus 1302 (e.g., by the decoder 1306), to the base station 1350. In one configuration, the transmission component 1312 may be configured to transmit, to the base station 1350, a NACK feedback when at least one CBG in the second subset of CBGs fails decoding. In some configurations, an ACK/NACK feedback may be transmitted further based on the preemption indicator. The apparatus 1302 may be configured to send (e.g., transmit via the transmission component 1312) additional ACK/NACK feedback based on the decoding result of the received retransmission of the full set of CBGs or the first subset of CBGs.

The apparatus may include additional components that perform each of the blocks of the algorithm in the aforementioned flowchart of FIG. 10. As such, each block in the aforementioned flowchart of FIG. 10 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

Figure 14:
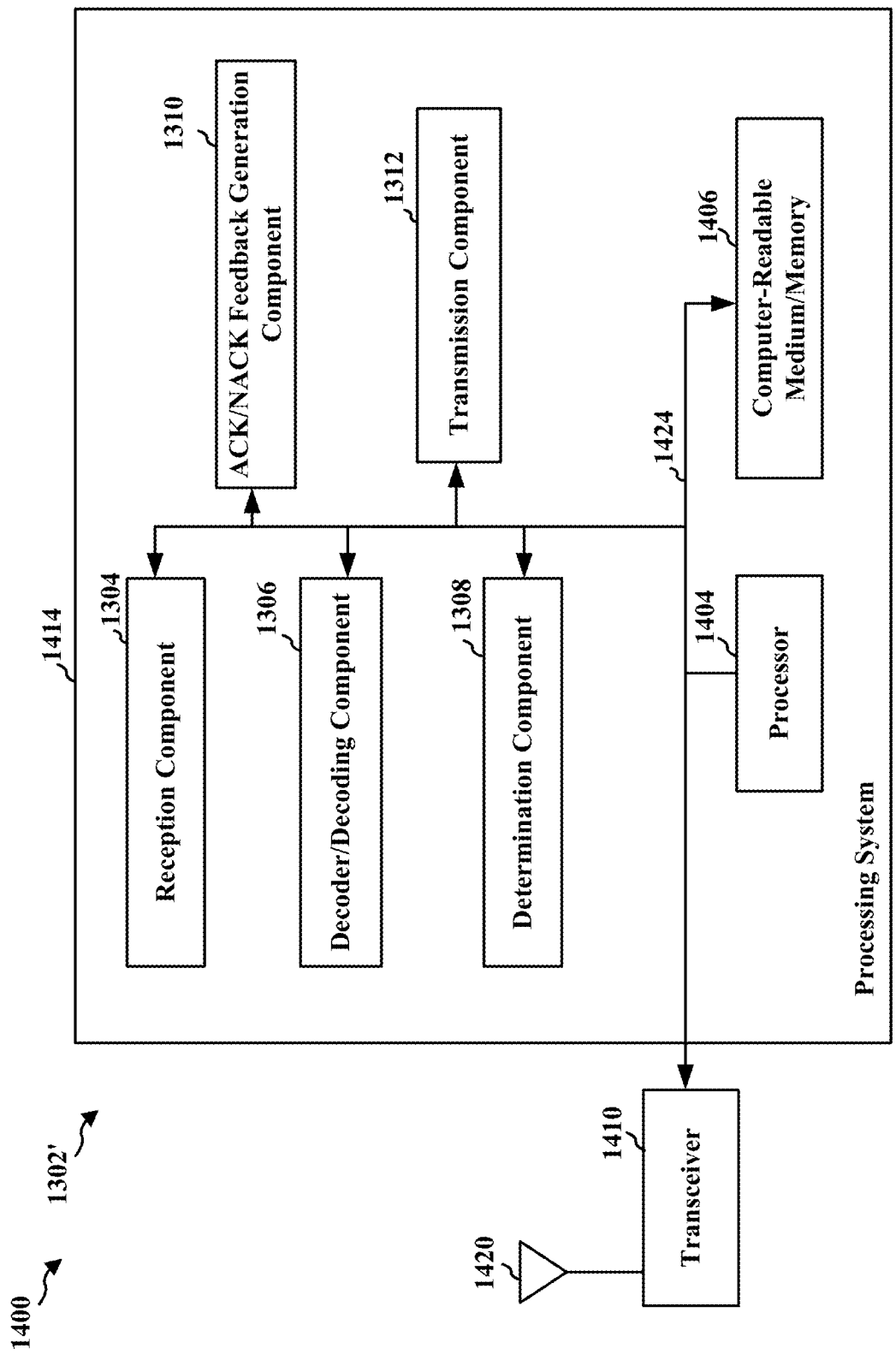
FIG. 14 is a diagram illustrating an example of a hardware implementation for an apparatus employing a processing system.

FIG. 14 is a diagram 1400 illustrating an example of a hardware implementation for an apparatus 1302' employing a processing system 1414. The processing system 1414 may be implemented with a bus architecture, represented generally by the bus 1424. The bus 1424 may include any number of interconnecting buses and bridges depending on the specific application of the processing system 1414 and the overall design constraints. The bus 1424 links together various circuits including one or more processors and/or hardware components, represented by the processor 1404, the components 1304, 1306, 1308, 1310, 1312, and the computer-readable medium/memory 1406. The bus 1424 may also link various other circuits such as timing sources, peripherals, voltage regulators, and power management circuits, which are well known in the art, and therefore, will not be described any further.

The processing system 1414 may be coupled to a transceiver 1410. The transceiver 1410 is coupled to one or more antennas 1420. The transceiver 1410 provides a means for communicating with various other apparatus over a transmission medium. The transceiver 1410 receives a signal from the one or more antennas 1420, extracts information from the received signal, and provides the extracted information to the processing system 1414, specifically the reception component 1304. In addition, the transceiver 1410 receives information from the processing system 1414, specifically the transmission component 1312, and based on the received information, generates a signal to be applied to the one or more antennas 1420. The processing system 1414 includes a processor 1404 coupled to a computer-readable medium/memory 1406. The processor 1404 is responsible for general processing, including the execution of software stored on the computer-readable medium/memory 1406. The software, when executed by the processor 1404, causes the processing system 1414 to perform the various functions described supra for any particular apparatus. The computer-readable medium/memory 1406 may also be used for storing data that is manipulated by the processor 1404 when executing software. The processing system 1414 further includes at least one of the components 1304, 1306, 1308, 1310, 1312. The components may be software components running in the processor 1404, resident/stored in the computer-readable medium/memory 1406, one or more hardware components coupled to the processor 1404, or some combination thereof. The processing system 1414 may be a component of the UE 350 and may include the memory 360 and/or at least one of the TX processor 368, the RX processor 356, and the controller/processor 359.

In one configuration, the apparatus 1302/1302' for wireless communication may comprise means for decoding a set of CBGs received from a base station, the set of CBGs including a first subset of CBGs and a second subset of CBGs, the first subset of CBGs having been transmitted on at least partially punctured resources. The apparatus 1302/1302' may further comprise means for transmitting a acknowledgement (ACK)/negative ACK (NACK) feedback based on the decoding to the base station. The apparatus 1302/1302' may further comprise means for receiving a retransmission of one of the set of CBGs or the first subset of CBGs based on the transmitted ACK/NACK feedback.

In some configurations, the means for receiving is further configured to receive a retransmission grant including a CBG list and a retransmission type indicator, where the CBG list indicates one or more CBGs of the set of CBGs that were transmitted by the base station on the at least partially punctured resources, and the retransmission type indicator indicates whether the retransmission includes the set of CBGs or the first subset of CBGs. In some configurations, the means for transmitting is configured to transmit ACK feedback when all CBGs in the received set of CBGs, except the first subset of CBGs, are successfully decoded at the apparatus, and transmit the NACK feedback when at least one CBG in the second subset of CBGs fails decoding at the apparatus. In some configurations, the means for receiving is further configured to receive an indicator indicating the at least partially punctured resources, where the indicator may be received prior to the retransmission grant.

In some configurations, the retransmission type indicator may indicate that the retransmission includes the first subset of CBGs only. In some such configurations, the means for receiving is configured to receive the first subset of CBGs in the retransmission. In some such configurations, the apparatus 1302/1302' may further comprise means for determining, based on the retransmission type indicator, that the CBG list indicates CBGs included in the retransmission. The means for determining may be further configured to determine if the CBGs indicated in the CBG list correspond to CBGs which failed the decoding. In some such configurations, the means for decoding is further configured to decode the retransmitted first subset of CBGs without performing soft combining based on previously stored log-likelihood ratio (LLR) values for the first subset of CBGs when the CBGs indicated in the CBG list correspond to the CBGs which failed the decoding.

In some configurations, the retransmission type indicator may indicate that the retransmission includes the set of CBGs. In some such configurations, the means for receiving is configured to receive the set of CBGs in the retransmission. In some such configurations, the apparatus 1302/1302' may further comprise means for determining, based on the retransmission type indicator, that the CBG list indicates CBGs for which previously stored LLR values should be nulled. In some such configurations, the means for decoding is further configured to decode the retransmitted first subset of CBGs without performing soft combining based on the previously stored LLR values, and decode the retransmitted second subset of CBGs with soft combining based on previously stored LLR values for the second subset of CBGs.

The aforementioned means may be one or more of the aforementioned components of the apparatus 1302 and/or the processing system 1414 of the apparatus 1302' configured to perform the functions recited by the aforementioned means. As described supra, the processing system 1414 may include the TX Processor 368, the RX Processor 356, and the controller/processor 359. As such, in one configuration, the aforementioned means may be the TX Processor 368, the RX Processor 356, and the controller/processor 359 configured to perform the functions recited by the aforementioned means.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of wireless communication of a base station, comprising:
    transmitting, to a user equipment (UE), a transport block (TB) including a set of codeblock groups (CBGs) including a first subset of CBGs and a second subset of CBGs, the first subset of CBGs being transmitted on at least partially punctured resources and the second subset of CBGs being transmitted on non-punctured resources;
    transmitting, to the UE, an indicator indicating the first subset of CBGs transmitted on the at least partially punctured resources;
    receiving, from the UE, an acknowledgement (ACK) or negative ACK (NACK) feedback based on the transmitted set of CBGs; and
    retransmitting one of the set of CBGs or the first subset of CBGs only, comprising transmitting a CBG list in a retransmission grant after transmitting the indicator, the CBG list including information indicating the first subset of CBGs that were transmitted on the at least partially punctured resources, based at least in part on the received ACK or NACK feedback.

2. The method of claim 1, wherein the retransmission grant further includes a retransmission type indicator indicating whether the set of CBGs is retransmitted or whether retransmission includes only the first subset of CBGs.

3. The method of claim 1, wherein the set of CBGs comprising the TB is retransmitted when the received ACK or NACK feedback is a NACK; and
    wherein only the first subset of CBGs is retransmitted when the received ACK or NACK feedback is an ACK.

4. The method of claim 1, wherein the received ACK or NACK feedback is an ACK, the ACK indicating that all CBGs in the set of CBGs except the first subset of CBGs are successfully decoded.

5. The method of claim 1, wherein the received ACK or NACK feedback is a NACK, the NACK indicating that at least one CBG in the second subset of CBGs failed decoding.

6. The method of claim 1, wherein the CBG list is based on information included in the indicator, the indicator having been transmitted to the UE prior to the CBG list.

7. The method of claim 1, wherein the received ACK or NACK feedback is a single bit feedback.

8. The method of claim 1, wherein the retransmitting further comprises transmitting the first subset of CBGs only when ACK feedback is received from the UE.

9. The method of claim 1, wherein the retransmitting further comprises retransmitting the set of CBGs when NACK feedback is received from the UE.

10. An apparatus for wireless communication, comprising:
    at least one processor coupled to a memory and configured to:
        transmit, to a user equipment (UE), a transport block (TB) including a set of codeblock groups (CBGs) including a first subset of CBGs and a second subset of CBGs, the first subset of CBGs being transmitted on at least partially punctured resources and the second subset of CBGs being transmitted on non-punctured resources;
        transmit, to the UE, an indicator indicating the first subset of CBGs transmitted on the at least partially punctured resources;
        receive, from the UE, an acknowledgement (ACK) or negative ACK (NACK) feedback based on the transmitted set of CBGs; and
        retransmit one of the set of CBGs or the first subset of CBGs, comprising transmission of a CBG list in a retransmission grant after transmitting the indicator, the CBG list including information indicating the first subset of CBGs that were transmitted on the at least partially punctured resources, based at least in part on the received ACK or NACK feedback.

11. The apparatus of claim 10, wherein the retransmission grant further includes a retransmission type indicator indicating whether the set of CBGs is retransmitted or whether the retransmission includes only the first subset of CBGs.

12. The apparatus of claim 10, wherein the at least one processor is further configured to retransmit the set of CBGs comprising the TB when the received ACK or NACK feedback is a NACK; and
    wherein the at least one processor is further configured to retransmit only the first subset of CBGs when the received ACK or NACK feedback is an ACK.

13. The apparatus of claim 10, wherein the CBG list is based on information included in the indicator, the indicator having been transmitted to the UE prior to the CBG list.

14. An apparatus of wireless communication of a base station, comprising:
    means for transmitting, to a user equipment (UE), a transport block (TB) including a set of codeblock groups (CBGs) including a first subset of CBGs and a second subset of CBGs, the first subset of CBGs being transmitted on at least partially punctured resources and the second subset of CBGs being transmitted on non-punctured resources;
    means for transmitting, to the UE, an indicator indicating the first subset of CBGs transmitted on the at least partially punctured resources;
    means for receiving, from the UE, an acknowledgement (ACK) or negative ACK (NACK) feedback based on the transmitted set of CBGs; and
    means for retransmitting one of the set of CBGs or the first subset of CBGs only, comprising a CBG list in a retransmission grant after transmitting the indicator, the CBG list including information indicating the first subset of CBGs that were transmitted on the at least partially punctured resources, based at least in part on the received ACK or NACK feedback.

15. The apparatus of claim 14, wherein the retransmission grant further includes a retransmission type indicator indicating whether the set of CBGs is retransmitted or whether the retransmission includes only the first subset of CBGs.

16. A method of wireless communication of a user equipment (UE), comprising:
    decoding a set of codeblock groups (CBGs) received from a base station, the set of CBGs including a first subset of CBGs and a second subset of CBGs, the first subset of CBGs having been transmitted on at least partially punctured resources;
    receiving an indicator indicating the first subset of CBGs transmitted on the at least partially punctured resources;
    transmitting, to the base station, an acknowledgement (ACK) or negative ACK (NACK) feedback based on the decoding; and
    receiving from the base station, based on the transmitted ACK or NACK feedback, a retransmission of one of the set of CBGs or the first subset of CBGs, comprising receiving a CBG list in a retransmission grant after receiving the indicator, the CBG list indicating one or more CBGs of the set of CBGs that were transmitted by the base station on the at least partially punctured resources.

17. The method of claim 16, further comprising:
    receiving a retransmission type indicator indicating whether the retransmission includes the set of CBGs or the first subset of CBGs.

18. The method of claim 16, wherein the transmitted ACK or NACK feedback is an ACK, wherein the ACK is transmitted when all CBGs in the received set of CBGs, except the first subset of CBGs, are successfully decoded at the UE.

19. The method of claim 16, wherein the transmitted ACK or NACK feedback is a NACK, wherein the NACK is transmitted when at least one CBG in the second subset of CBGs fails decoding at the UE.

20. The method of claim 16, wherein the transmitting the ACK or NACK feedback is further based on the received indicator.

21. The method of claim 17, wherein the retransmission type indicator indicates that the retransmission includes the first subset of CBGs only, the method further comprising:
    receiving the first subset of CBGs in the retransmission;
    determining, based on the retransmission type indicator, that the CBG list indicates CBGs included in the retransmission;
    determining if the CBGs indicated in the CBG list correspond to CBGs which failed the decoding; and
    decoding, in response to determining that the CBGs indicated in the CBG list correspond to the CBGs which failed the decoding, the retransmitted first subset of CBGs without performing soft combining based on previously stored log-likelihood ratio (LLR) values for the first subset of CBGs.

22. The method of claim 17, wherein the retransmission type indicator indicates that the retransmission includes the set of CBGs, the method further comprising:
    receiving the set of CBGs in the retransmission;
    determining, based on the retransmission type indicator, that the CBG list indicates CBGs for which previously stored log-likelihood ratio (LLR) values should be nulled;
    decoding, the retransmitted first subset of CBGs without performing soft combining based on the previously stored LLR values; and
    decoding, the retransmitted second subset of CBGs, with soft combining based on previously stored LLR values for the second subset of CBGs.

23. The method of claim 16, wherein the retransmission comprises the first subset of CBGs only when ACK feedback is received from the UE.

24. The method of claim 16, wherein the retransmission comprises the set of CBGs when NACK feedback is received from the UE.

25. A user equipment (UE) for wireless communication, comprising:
    at least one processor coupled to a memory and configured to:
        decode a set of codeblock groups (CBGs) received from a base station, the set of CBGs including a first subset of CBGs and a second subset of CBGs, the first subset of CBGs having been transmitted on at least partially punctured resources;
        receive an indicator indicating the first subset of CBGs transmitted on the at least partially punctured resources;
        transmit, to the base station, an acknowledgement (ACK) or negative ACK (NACK) feedback based on the decoding; and
        receive from the base station, based on the transmitted ACK or NACK feedback, a retransmission of one of the set of CBGs or the first subset of CBGs, comprising reception of a CBG list in a retransmission grant after receiving the indicator, the CBG list indicating one or more CBGs of the set of CBGs that were transmitted by the base station on the at least partially punctured resources.

26. The UE of claim 25, wherein the at least one processor is further configured to receive a retransmission type indicator indicating whether the retransmission includes the set of CBGs or the first subset of CBGs.

27. The UE of claim 25, wherein the transmitted ACK or NACK feedback is an ACK, wherein the at least one processor is configured to transmit the ACK when all CBGs in the received set of CBGs, except the first subset of CBGs, are successfully decoded at the UE.

28. The UE of claim 25, wherein the transmitted ACK or NACK feedback is a NACK, wherein the at least one processor is configured to transmit the NACK when at least one CBG in the second subset of CBGs fails decoding at the UE.

29. The UE of claim 26, wherein the retransmission type indicator indicates that the retransmission includes the first subset of CBGs only, wherein the at least one processor is further configured to:
receive the first subset of CBGs in the retransmission;
determine, based on the retransmission type indicator, that the CBG list indicates CBGs included in the retransmission;
determine if the CBGs indicated in the CBG list correspond to CBGs which failed the decoding; and
decode, in response to determining that the CBGs indicated in the CBG list correspond to the CBGs which failed the decoding, the retransmitted first subset of CBGs without performing soft combining based on previously stored log-likelihood ratio (LLR) values for the first subset of CBGs.

30. The UE of claim 26, wherein the retransmission type indicator indicates that the retransmission includes the set of CBGs; wherein the at least one processor is further configured to:
receive the set of CBGs in the retransmission;
determine, based on the retransmission type indicator, that the CBG list indicates CBGs for which previously stored log-likelihood ratio (LLR) values should be nulled; and
decode the retransmitted first subset of CBGs without performing soft combining based on the previously stored LLR values, and decode the retransmitted second subset of CBGs with soft combining based on previously stored LLR values for the second subset of CBGs.

31. A user equipment (UE) for wireless communication, comprising:
means for decoding a set of codeblock groups (CBGs) received from a base station, the set of CBGs including a first subset of CBGs and a second subset of CBGs, the first subset of CBGs having been transmitted on at least partially punctured resources;
means for receiving an indicator indicating the first subset of CBGs transmitted on the at least partially punctured resources;
means for transmitting an acknowledgement (ACK) or negative ACK (NACK) feedback based on the decoding to the base station; and
means for receiving a retransmission of one of the set of CBGs or the first subset of CBGs based on the transmitted ACK or NACK feedback comprising receiving a CBG list in a retransmission grant after receiving the indicator, the CBG list indicating one or more CBGs of the set of CBGs that were transmitted by the base station on the at least partially punctured resources.

32. The UE of claim 31, wherein the means for receiving is further configured to receive a retransmission type indicator indicating whether the retransmission includes the set of CBGs or the first subset of CBGs.

33. The UE of claim 31, wherein the transmitted ACK or NACK feedback is an ACK, wherein the ACK is transmitted when all CBGs in the received set of CBGs, except the first subset of CBGs, are successfully decoded at the UE.

34. The UE of claim 32, wherein the retransmission type indicator indicates that the retransmission includes the first subset of CBGs only;
wherein the means for receiving is configured to receive the first subset of CBGs in the retransmission;
wherein the UE further comprises means for determining, based on the retransmission type indicator, that the CBG list indicates CBGs included in the retransmission, wherein the means for determining is further configured to determine if the CBGs indicated in the CBG list correspond to CBGs which failed the decoding; and
wherein the means for decoding is further configured to decode the retransmitted first subset of CBGs without performing soft combining based on previously stored log-likelihood ratio (LLR) values for the first subset of CBGs when the CBGs indicated in the CBG list correspond to the CBGs which failed the decoding.

35. The UE of claim 32, wherein the retransmission type indicator indicates that the retransmission includes the set of CBGs;
wherein the means for receiving is configured to receive the set of CBGs in the retransmission;
wherein the UE further comprises means for determining, based on the retransmission type indicator, that the CBG list indicates CBGs for which previously stored log-likelihood ratio (LLR) values should be nulled; and
wherein the means for decoding is further configured to decode the retransmitted first subset of CBGs without performing soft combining based on the previously stored LLR values, and decode the retransmitted second subset of CBGs with soft combining based on previously stored LLR values for the second subset of CBGs.

* * * * *